United States Patent
Hamaguchi et al.

(10) Patent No.: US 9,407,067 B2
(45) Date of Patent: Aug. 2, 2016

(54) LIGHT EMITTING ELEMENT AND METHOD OF MANUFACTURING THE SAME

(71) Applicant: Sony Corporation, Tokyo (JP)

(72) Inventors: Tatsushi Hamaguchi, Kanagawa (JP); Masaru Kuramoto, Kanagawa (JP); Yuki Maeda, Kanagawa (JP); Noriyuki Futagawa, Kangawa (JP)

(73) Assignee: SONY CORPORATION, Tokyo (JP)

( * ) Notice: Subject to any disclaimer, the term of this patent is extended or adjusted under 35 U.S.C. 154(b) by 0 days.

(21) Appl. No.: 14/449,840

(22) Filed: Aug. 1, 2014

(65) Prior Publication Data
US 2015/0043601 A1  Feb. 12, 2015

(30) Foreign Application Priority Data

Aug. 9, 2013 (JP) ................................ 2013-166571

(51) Int. Cl.
| | |
|---|---|
| *H01S 5/30* | (2006.01) |
| *H01S 5/183* | (2006.01) |
| *H01S 5/02* | (2006.01) |
| *H01S 5/343* | (2006.01) |

(52) U.S. Cl.
CPC ............... *H01S 5/3013* (2013.01); *H01S 5/183* (2013.01); *H01S 5/18361* (2013.01); *H01S 5/18388* (2013.01); *H01S 5/18391* (2013.01); *H01S 5/0216* (2013.01); *H01S 5/0217* (2013.01); *H01S 5/18311* (2013.01); *H01S 5/18341* (2013.01); *H01S 5/18369* (2013.01); *H01S 5/34333* (2013.01); *H01S 2304/12* (2013.01)

(58) Field of Classification Search
CPC ...... H01L 33/105; H01L 33/465; H01S 5/183; H01S 5/18361; H01S 5/0217; H01S 5/0216
See application file for complete search history.

(56) References Cited

U.S. PATENT DOCUMENTS

| | | | | |
|---|---|---|---|---|
| 5,146,465 A | * | 9/1992 | Khan | ..................... B82Y 20/00 257/E33.005 |
| 7,416,930 B2 | * | 8/2008 | Lee | ....................... H01S 5/0261 438/197 |
| 2010/0046565 A1 | * | 2/2010 | Masui | ................. H01S 5/18336 372/45.01 |
| 2013/0100978 A1 | * | 4/2013 | Hardy | .................. H01L 29/205 372/45.012 |

FOREIGN PATENT DOCUMENTS

JP     2010-123921 A     6/2010

* cited by examiner

*Primary Examiner* — Yuanda Zhang
*Assistant Examiner* — Michael Carter
(74) *Attorney, Agent, or Firm* — Sheridan Ross P.C.

(57) ABSTRACT

A method of manufacturing a light emitting element includes, sequentially (a) forming a first light reflecting layer having a convex shape; (b) forming a layered structure body by layering a first compound semiconductor layer, an active layer, and a second compound semiconductor layer; (c) forming, on the second surface of the second compound semiconductor layer, a second electrode and a second light reflecting layer formed from a multilayer film; (d) fixing the second light reflecting layer to a support substrate; (e) removing the substrate for manufacturing a light emitting element, and exposing the first surface of the first compound semiconductor layer and the first light reflecting layer; (f) etching the first surface of the first compound semiconductor layer; and (g) forming a first electrode on at least the etched first surface of the first compound semiconductor layer.

13 Claims, 18 Drawing Sheets

LIGHT EMITTING ELEMENT AND METHOD OF MANUFACTURING THE SAME

CROSS REFERENCE TO RELATED APPLICATIONS

This application claims the benefit of Japanese Priority Patent Application JP 2013-166571 filed Aug. 9, 2013, the entire contents of which are incorporated herein by reference.

BACKGROUND

The present disclosure relates to a light emitting element and a method of manufacturing the same.

Surface-emitting laser elements (vertical resonator laser, VCSEL) configured from a nitride semiconductor are known from, for example, Japanese Unexamined Patent Application Publication No. 2010-123921. The surface-emitting laser element disclosed in the unexamined patent publication is manufactured by forming a layered body of a nitride semiconductor in which a second conductivity type layer, a light emitting layer and a first conductivity type layer are layered on a substrate, forming a first black reflector formed from a dielectric multilayer film on a first conductivity type layer, forming a first electrode electrically connected to the first conductivity type layer on the first black reflector, bonding the layered body to a support substrate via the first black reflector and the first electrode, exposing the second conductivity type layer by removing the substrate from the layered body, and forming a second electrode, and a second black reflector formed from a dielectric multilayer film and arranged to oppose the first black reflector on the surface in which the second conductivity type layer is exposed.

Although the second conductivity type layer is exposed by removing a part or all of the substrate from the layered body, a laser lift off method, polishing, etching or the like are used for the removal of the substrate. Scattering of light by the surface of the second conductivity type layer is suppressed to the lowest limit by mirror finishing the exposed surface of the second conductivity type layer based on a chemical/mechanical polishing (CMP) method using a suitable polishing agent, an etching method using a suitable etchant, or the like. A second electrode and a second black reflector are formed in an arbitrary order on the mirror finished surface of the second conductivity type layer.

SUMMARY

Incidentally, on the surface of the substrate, it is important to achieve uniformity in the lengths of the first black reflector in each surface-emitting laser element, the layered body, and the resonator formed from the second black reflector (more specifically, the thickness of the layered body). Therefore, it is important to suppress the occurrence of variations, for example, in the removal amount of the second conductivity type layer based on a CMP method on the surface of the substrate. However, there is no mention in the unexamined patent publication with respect to a means for suppressing the occurrence of variations in the removal amount of the second conductivity type layer on the surface of the substrate. There is a problem of the contact resistance between the second conductivity type layer and the second electrode easily rising when the second electrode is formed on the mirror finished surface of the second conductivity type layer.

Accordingly, it is desirable to provide a light emitting element having a configuration and a structure able to achieve uniformity in the length of a resonator, and a method of manufacturing the same. It is also desirable to provide a light emitting element having a configuration and a structure able to suppress a rise in the contact resistance between a GaN-based compound semiconductor layer and an electrode, and a method of manufacturing the same.

According to a first embodiment of the present disclosure, there is provided a method of manufacturing a light emitting element including, sequentially, (a) forming a first light reflecting layer having a convex shape formed from a multilayer film on a substrate for manufacturing a light emitting element; (b) forming a layered structure body by layering a first compound semiconductor layer formed from a GaN-based compound semiconductor, which has a first surface and a second surface opposing the first surface, an active layer formed from a GaN-based compound semiconductor, which contacts the second surface of the first compound semiconductor layer, and a second compound semiconductor layer formed from a GaN-based compound semiconductor, which has a first surface and a second surface opposing the first surface, and in which the first surface contacts the active layer on the substrate for manufacturing a light emitting element that includes the first light reflecting layer; (c) forming, on the second surface of the second compound semiconductor layer, a second electrode and a second light reflecting layer formed from a multilayer film; (d) fixing the second light reflecting layer to a support substrate; (e) removing the substrate for manufacturing a light emitting element, and exposing the first surface of the first compound semiconductor layer and the first light reflecting layer; (f) etching the first surface of the first compound semiconductor layer; and (g) forming a first electrode on at least the etched first surface of the first compound semiconductor layer.

According to a second embodiment of the present disclosure, there is provided a method of manufacturing a light emitting element including, sequentially, (a) forming a convexity formed from a material different from a material that configures a first compound semiconductor layer on a substrate for manufacturing a light emitting element; (b) forming a layered structure body by layering a first compound semiconductor layer formed from a GaN-based compound semiconductor, which has a first surface and a second surface opposing the first surface, an active layer formed from a GaN-based compound semiconductor, which contacts the second surface of the first compound semiconductor layer, and a second compound semiconductor layer formed from a GaN-based compound semiconductor, which has a first surface and a second surface opposing the first surface, and in which the first surface contacts the active layer on the substrate for manufacturing a light emitting element that includes the convexity; (c) forming, on the second surface of the second compound semiconductor layer, a second electrode and a second light reflecting layer formed from a multilayer film; (d) fixing the second light reflecting layer to a support substrate; (e) removing the substrate for manufacturing a light emitting element, and exposing the first surface of the first compound semiconductor layer and the convexity; and (f) removing the convexity, forming a first light reflecting layer formed from a multilayer film on at least a part of the first surface on the first compound semiconductor layer from which the convexity is removed, and forming a first electrode on at least a part of the first surface of the first compound semiconductor layer on which the first electrode is to be formed. The first electrode may be formed after the first light reflecting layer is formed, or the first light reflecting layer may be formed after the first electrode is formed.

According to another embodiment of the present disclosure, there is provided a light emitting element including (A)

a layered structure body formed by layering a first compound semiconductor layer formed from a GaN-based compound semiconductor, which has a first surface and a second surface opposing the first surface, an active layer formed from a GaN-based compound semiconductor, which contacts the second surface of the first compound semiconductor layer, and a second compound semiconductor layer formed from a GaN-based compound semiconductor, which has a first surface and a second surface opposing the first surface, and in which the first surface contacts the active layer; (B) a first electrode and a first light reflecting layer; and (C) a second electrode and a second light reflecting layer formed from a multi layer film formed on the second surface of the second compound semiconductor layer, in which a concavity with a forward tapered side surface is formed on the first surface of the first compound semiconductor layer, the first light reflecting layer is formed on at least the concavity, and the first electrode is formed on at least the first surface of the first compound semiconductor layer.

In the method of manufacturing a light emitting element according to the first embodiment of the present disclosure, the substrate for manufacturing a light emitting element is removed in a state in which the first light reflecting layer is formed. In the method of manufacturing a light emitting element according to the second embodiment of the disclosure, the substrate for manufacturing a light emitting element is removed in a state in which a convexity is formed. When removing the substrate for manufacturing a light emitting element, since the first light reflecting layer or the convexity function as one type of stopper, it is possible to suppress the occurrence of removal variations in the substrate for manufacturing a light emitting element on the surface of the substrate for manufacturing a light emitting element, and further, the occurrence of thickness variations the first compound semiconductor layer, and possible to achieve uniformity in the length of the resonator, it is possible to achieve stability in the characteristics of the obtained light emitting element. In the method of manufacturing a light emitting element according to the first embodiment of the present disclosure, since the first electrode is formed on at least the etched first surface of the first compound semiconductor layer after the exposed first compound semiconductor layer is etched, it is possible to suppress a rise in the contact resistance between the first compound semiconductor layer and the first electrode. In the light emitting element of the present disclosure, since the first light reflecting layer is formed on a concavity in which the side surface has a forward taper, it is possible to suppress disturbances in the formation of a multilayer film of a portion of the first light reflecting layer formed on the side surface of the concavity and in the vicinity of the side surface that is the bottom surface of the concavity. The effect described in the specification is merely an example and the disclosure is not limited thereto, and there may be additional effects.

DETAILED DESCRIPTION OF EMBODIMENTS

Figure 1A:
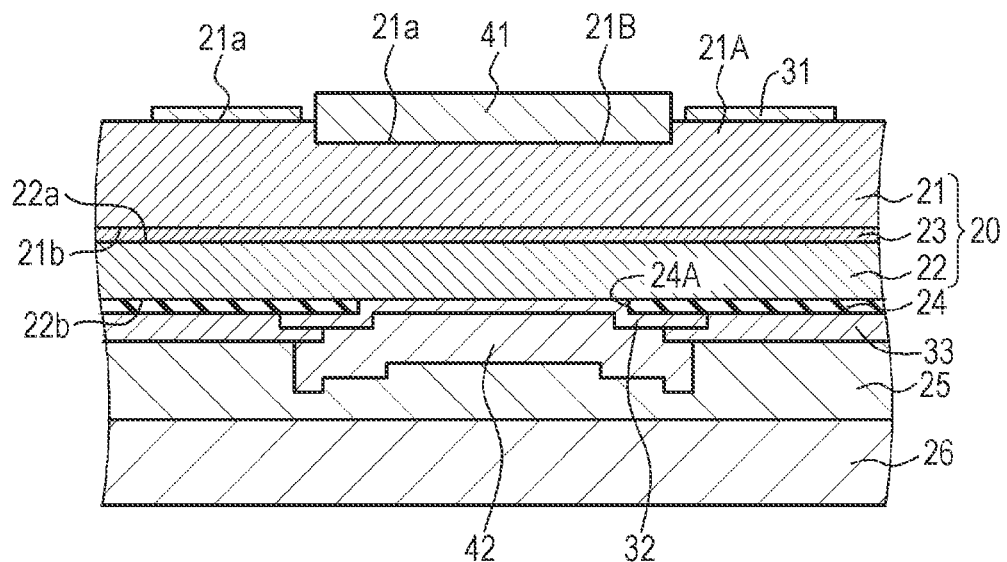
FIGS. 1A and 1B are both schematic partial end face views of a light emitting element and a modification example of the light emitting element of Embodiment 1.

Below, although the present disclosure will be described based on the embodiments with reference to the diagrams, the disclosure is not limited to the embodiments, and various numerical values or materials are given as examples in the embodiments. The description will be given in the following order.

1. Description Relating Generally to Method of Manufacturing Light Emitting Element According to First Embodiment and Second Embodiment of Disclosure and Light Emitting Element of Disclosure 2. Embodiment 1 (Method of Manufacturing Light Emitting Element According to First Embodiment of Disclosure)

3. Embodiment 2 (Method of Manufacturing Light Emitting Element According to Second Embodiment of Disclosure, Light Emitting Element of Disclosure)

4. Embodiment 3 (Modification of Embodiment 1 and Embodiment 2), Others
Description Relating Generally to Method of Manufacturing Light Emitting Element According to First Embodiment and Second Embodiment of Disclosure, and Light Emitting Element of Disclosure In the method of manufacturing a light emitting element according to the first embodiment or the second embodiment of the disclosure, it is possible to perform exposure of the first surface of the first compound semiconductor layer and the first light reflecting layer or the convexity in step (e) based on a chemical/mechanical polishing method (CMP method). First, removal of the substrate for manufacturing a light emitting element is performed by a wet etching method using an alkaline aqueous solution, such as an aqueous solution of potassium hydroxide or an aqueous solution of sodium hydroxide, an ammonia solution+a hydrogen peroxide, a sulfuric acid solution+a hydrogen peroxide, a hydrochloric acid solution+hydrogen peroxide, a phosphoric acid solution+hydrogen peroxide, a dry etching method, a lift off method using a laser, mechanical polishing method or the like, or by a combination thereof, or the thickness of the substrate for manufacturing a light emitting element is thinned, then the first surface or the like of the first compound semiconductor layer is exposed by performing a chemical/mechanical polishing method.

In the method of manufacturing a light emitting element according to the second embodiment of the disclosure including the preferred form, it is possible to etch a part of the first surface of the first compound semiconductor layer on which the first electrode is to be formed before forming the first electrode on the first surface of the first compound semiconductor layer in step (f). In this case, the following procedures are given as examples of the procedure of removal of the convexity, formation of the first light reflecting layer, etching of the first compound semiconductor layer, and formation of the first electrode in step (f).

(f-1) removal of the convexity, formation of the first light reflecting layer, etching of the first compound semiconductor layer, formation of the first electrode
(f-2) removal of the convexity, etching of the first compound semiconductor layer, formation of the first light reflecting layer, formation of the first electrode
(f-3) removal of the convexity, etching of the first compound semiconductor layer, formation of the first electrode, formation of the first light reflecting layer
(f-4) etching of the first compound semiconductor layer, removal of the convexity, formation of the first light reflecting layer, formation of the first electrode
(f-5) etching of the first compound semiconductor layer, removal of the convexity, formation of the first electrode, formation of the first light reflecting layer
(f-6) etching of the first compound semiconductor layer, formation of the first electrode, removal of the convexity, formation of the first light reflecting layer Furthermore, in the method of manufacturing a light emitting element according to the first embodiment or the second embodiment of the disclosure including the preferred form described above, it is possible to etch the part of the first surface of the first compound semiconductor layer on which the first electrode is to be formed based on a reactive ion etching method (RIE method). However, it is also possible to use a reactive ion beam etching (RIBE) method, an electron cyclotron resonance (ECR) etching method, an ion beam etching method, or the like, instead of the reactive ion etching method. Embodiments of the etching gas include a fluorine-based gas, such as $CF_4$, a chlorine-based gas, such as $Cl_2$, $CCl_4$, $SiCl_4$, and an iodine-based gas, such as HI. The etching gas may be used singly, or may be mixed and used.

Furthermore, in the method of manufacturing a light emitting element according to the second embodiment of the disclosure including the various preferred forms described above, the convexity formed in step (a) may adopt a form where the top surface is smaller than the bottom surface.

In the method of manufacturing a light emitting element according to the first or second embodiments of the disclosure including the various preferred forms described above or the light emitting element of the disclosure, it is possible to adopt a form where the area centroid of the second light reflecting layer is not present on a normal line with respect to the first light reflecting layer passing through area centroid of the first light reflecting layer.

In the method of manufacturing a light emitting element according to the first or second embodiment of the disclosure including the various preferred forms described above or the light emitting element of the disclosure, it is possible to adopt a form where the area centroid of the active layer is not present on a normal line with respect to the first light reflecting layer passing through area centroid of the first light reflecting layer.

On the substrate for manufacturing a light emitting element on which the first light reflecting layer or the concavity is formed, when the first compound semiconductor layer is formed using horizontal growth using a method in which epitaxial growth is caused in the horizontal direction, such as an epitaxial lateral overgrowth (ELO) method, if first compound semiconductor layers that are epitaxially grown from the edge portion of the first light reflecting layer or the convexity towards the center portion of the first light reflecting layer or the convexities meet, there are cases in which numerous crystal defects occur in the meeting part. If the meeting parts in which numerous crystal defects are present are positioned at the center portion of the element region (described later), there is concern of an adverse influence being exerted on the characteristics of the light emitting element. It is possible to reliably suppress the occurrence an adverse influence on the characteristics of the light emitting element, by attaining a state in which the area centroid of the second light reflecting layer is not present on the normal line with respect to the first light reflecting layer passing through the area centroid of the first light reflecting layer, and a state in which the area centroid of the active layer is not present on the normal line with respect to the first light reflecting layer passing through the area centroid of the first light reflecting layer.

In the method of manufacturing a light emitting element according to the first or second embodiment of the disclosure including the various preferred forms described above, or the light emitting element of the disclosure, it is possible use a configuration in which the first light reflecting layer and the first electrode are in contact. Alternatively, it is possible to use a configuration in which the first light reflecting layer and the first electrode are separated, that is, an offset is provided, and the separation distance is within 1 mm. In this case, in the method of manufacturing a light emitting element according to the second embodiment of the disclosure, or the light emitting element of the disclosure, it is possible to use a configuration in which the protrusion part of the first compound semiconductor layer is present between the first light reflecting layer and the first electrode. If the element region (described later) positioned in the first light reflecting layer and the first electrode are separated, a current flows across a long distance in the first compound semiconductor layer. Therefore, it is preferable that the separation distance be within 1 mm in order to suppress the electrical resistance occurring in the current path to be low.

In the method of manufacturing a light emitting element according to the first of second embodiment of the disclosure including the various preferred forms and configuration described above, or the light emitting element of the disclosure, it is preferable that the distance from the first light reflecting layer to the second light reflecting layer be 0.15 μm or more and 50 μm or less.

In the method of manufacturing a light emitting element according to the first or second embodiment of the disclosure including the various preferred forms described above, or the light emitting element of the disclosure, it is possible use a configuration in which light generated in the active layer is emitted to the outside via the first light reflecting layer. In this case, it is desirable that $S_1 > S_2$ be satisfied, where the area of a part of the first light reflecting layer that contacts the first surface of the first compound semiconductor layer (part of the first light reflecting layer opposing the second light reflecting layer) is $S_1$, and the area of a part of the second light reflecting layer opposing the second surface of the second compound semiconductor layer (part of the second light reflecting layer opposing the first light reflecting layer) is $S_2$.

In a form in which the area centroid of the second light reflecting layer is not present on the normal line with respect to the first light reflecting layer passing through the area centroid of the first light reflecting layer, and a form in which the area centroid of the active layer is not present on the normal line with respect to the first light reflecting layer passing through the area centroid of the first light reflecting layer, it is desirable that $S_3 > S_4$ be satisfied, where the area of a part that configures the element region (described later), and is a part of the first light reflecting layer that contacts the first surface of the first compound semiconductor layer (part of the first light reflecting layer opposing the second light reflecting layer) is $S_3$, and the area of a part that configures the element region, and is a part of the second light reflecting layer opposing the second surface of the second compound semiconductor layer (part of the second light reflecting layer opposing the first light reflecting layer) is $S_4$.

In the light emitting element of the disclosure including the various preferred forms and configuration described above, it is possible to attain a form in which the second light reflecting layer is fixed to the support substrate.

In the method of manufacturing a light emitting element according to the first or second embodiment of the disclosure including the various preferred forms and configuration described above, the value of the surface roughness Ra of the part of the first surface of the first compound semiconductor layer (bottom surface of the concavity) that contacts the first light reflecting layer is $3 \times 10^{-9}$ m or less, and the value of the surface roughness Ra of the part of the first surface of the first compound semiconductor layer on which the first electrode is formed exceeds the value of the surface roughness Ra of the part of the first surface of the first compound semiconductor layer (bottom surface of the concavity) that contacts the first light reflecting layer. The surface roughness Ra is stipulated by JIS B-610:2001. It is possible to measure the surface roughness Ra, more specifically, based on observation based on AFM or cross-sectional TEM.

In the method of manufacturing a light emitting element according to the first or second embodiment of the disclosure including the various preferred forms and configuration described above, it is desirable that, $R_2/R_1 \leq 1$ be satisfied, where the contact resistance value of the part of the first surface of the first compound semiconductor layer (bottom surface of the concavity) that contacts the first light reflecting layer is $R_1$, and the contact resistance value of the part of the first surface of the first compound semiconductor layer on which the first electrode is formed is $R_2$.

Examples of the arrangement state of the first light reflecting layer and first electrode on the first surface of the first compound semiconductor layer may include the state in which the first light reflecting layer and the first electrode are in contact, or the state in which the first light reflecting layer and the first electrode are separated, as described above. Examples may also include a state in which the first electrode is formed up to the edge portion of the first light reflecting layer, and a state in which the first light reflecting layer is formed up to on the edge portion of the first electrode, according to the circumstances. In a case in which the first light reflecting layer is formed up to on the edge portion of the first electrode, it is necessary that the first electrode have an opening portion with given size so that basic mode light of laser oscillation is absorbed as little as possible. Since the size of the opening portion changes according to wavelength of the basic mode or the optical confinement structure in the horizontal direction (in-plane direction of the first compound semiconductor layer), although not limited thereto, the size is preferably on the order of approximately several times the oscillation wavelength λ.

In the method of manufacturing a light emitting element according to the first or second embodiment of the disclosure including the various preferred forms and configurations described above, or the light emitting element of the disclosure, it is possible to attain a state in which the first electrode is formed from a metal or an alloy, and the second electrode is formed from a transparent conductive material. By configuring the second electrode from a transparent conductive material, it is possible for the current to spread in the horizontal direction (in-plane direction of the second compound semiconductor layer), and possible to efficiently supply a current to the element region (described next). It is preferable that the second electrode be formed on the second surface of the second compound semiconductor layer, and the second light reflecting layer be formed on the second electrode.

The term "element region" indicates a region in which a constricted current is introduced, or a region in which light is confined by a difference in refractive index or the like, or a region in which laser oscillation occurs in a region interposed between the first light reflecting layer and the second light reflecting layer, or a region practically contributing to laser oscillation in a region interposed between the first light reflecting layer and the second light reflecting layer.

The light emitting element may have a structure formed from a surface-emitting laser element (vertical resonator laser, VCSEL) that emits light from the top surface of the first compound semiconductor layer via the first light reflecting layer, or may have a structure formed from a surface-emitting laser element that emits light from the top surface of the second compound semiconductor layer via the second light reflecting layer.

In the light emitting element of the disclosure including the various preferred forms and configuration described above and the method of manufacturing a light emitting element according to the first or second embodiment of the disclosure including the various preferred forms and configurations described above (below, these may be collectively referred to as simply "the disclosure"), it is, more specifically, possible for the layered structure body to have a structure formed from an AlGaInN-based compound semiconductor. Examples of the AlGaInN-based compound semiconductor, more specifically, include GaN, AlGaN, GaInN, and AlGaInN. These compound semiconductors may include boron (B) atoms, thallium (Tl) atoms, arsenic (As) atoms, phosphorus (P) atoms, and antimony (Sb) atoms as desired. It is desirable that the active layer have a quantum well structure. More specifically, the active layer may has a single quantum well structure (QW structure), or may have a multiple quantum well structure (MQW structure). Although the active layer having a quantum well structure includes a well layer and a barrier layer having a structure in which at least one layer is layered, examples of the combination of (compound semiconductor that configures the well layer, compound semiconductor that configures the barrier layer) includes ($In_yGa_{(1-y)}N$, GaN), ($In_yGa_{(1-y)}N$, $In_zGa_{(1-z)}N$) [where y>z], and ($In_yGa_{(1-y)}N$, AlGaN). It is possible to configure the first compound semiconductor layer from a first conductive type (for example, n-type) compound semiconductor, and configure the second compound semiconductor layer from a second conductive type (for example, p-type) compound semiconductor different from the first conductive type. The first compound semiconductor layer and the second compound semiconductor layer are also referred to as a first cladding layer and a second cladding layer. It is preferable that a current constriction structure be formed between the second electrode and the second compound semiconductor layer. The first compound semiconductor layer and the second compound semiconductor layer may be a single structure layer, may be a multi-layer structure layer, or may be a superlattice structure layer. Furthermore, it is also possible to use a layer including a composition gradient layer and a concentration gradient layer.

In order to obtain a current constriction structure, a current constriction layer formed from an insulating material (for example, $SiO_2$, SiN, or $Al_2O_3$) may be formed between the second electrode and the second compound semiconductor layer, or a mesa structure may be formed by etching the second compound semiconductor layer with an RIE method, or the like, or a current constriction region may be formed by partially oxidizing a portion of the layer of the layered second compound semiconductor layer from the lateral direction, and a region with lowered conductivity may be formed by ion implantation of impurities in the second compound semiconductor layer, or these may be combined, as appropriate. However, it is necessary that the second electrode be electrically connected with the part of the second compound semiconductor layer in which a current flows due to current constriction.

Examples of the substrate for manufacturing a light emitting element include a GaN substrate, a sapphire substrate, a GaAs substrate, an SiC substrate, an alumina substrate, a ZnS substrate, a ZnO substrate, an AlN substrate, an LiMgO substrate, an $LiGaO_2$ substrate, an $MgAl_2O_4$ substrate, an InP substrate, and an Si substrate, and substrates on which an underlayer or a buffer layer is formed on the surface (main surface) of these substrates. In a case of forming a GaN-based compound semiconductor layer on the substrate, the using a GaN substrate is preferable in light of a low density of defects. Although it is known that the polarity/non-polarity/semi-polarity and characteristics of the GaN substrate change according to the growth face, it is possible to use any of the main surfaces of the GaN substrate in forming the compound semiconductor layer. With respect to the main surface of these substrates, depending on the crystal structure (for example, cubical crystal-type, hexagonal crystal, or the like), it is possible to use the crystal orientation surfaces referred to by names such as the so-called A plane, B plane, C plane, R plane, M plane, N plane and S plane, or a surface offset in a specified direction therefrom. Examples of the method of forming the various compound semiconductor layers that configure the light emitting element include a metal organic chemical vapor deposition method (MOCVD method, MOVPE method), a molecular beam epitaxy method (MBE method), and a hydride vapor deposition method in which a halogen contributes to transportation or reaction.

Examples of the organogallium source gas in the MOCVD method include trimethyl gallium (TMG) gas and triethyl gallium (TEG) GAS, and examples of the nitrogen source gas include ammonia gas and hydrazine gas. In the formation of a GaN-based compound semiconductor layer having an n-type conductivity type, for example, silicon (Si) may be added as an n-type impurity (n-type dopant), and in the formation of a GaN-based compound semiconductor layer having a p-type conductivity type, for example, magnesium (Mg) may be added as a p-type impurity (p-type dopant). In a case where the GaN-based compound semiconductor layer includes aluminum (Al) or indium (In) as a constituent atom, trimethylaluminum (TMA) gas may be used as an Al source and trimethylindium (TMI) gas may be used as an In source. Monosilane gas ($SiH4$ gas) may be used as an Si source, and cyclopentadienylmagnesium gas, methylcyclopentadienyl magnesium, and biscyclopentadienylmagnesioum ($Cp_2Mg$) may be used as an Mg source. Examples of the n-type impurity (n-type dopant) include Ge, Se, Sn, C, Te, S, O, Pd and Po, in addition to Si, and examples of the p-type impurity (p-type dopant) include Zn, Cd, Be, Ca, Ba, C, Hg, and Sr, in addition to Mg.

Although he support substrate, for example, may be configured from various substrates given as examples of the substrate for manufacturing a light emitting element, or it is possible to configure the support substrate from an insulating substrate formed from AlN or the like, a semiconductor substrate formed from, Si, SiC, Ge or the like, a metallic substrate or an alloy substrate, it is preferable to use a substrate having conductivity, or preferable to use a metallic substrate or alloy substrate from the viewpoint of mechanical properties, elastic deformation, plastic deformation, heat dissipation or the like. Examples of the thickness of the support substrate, for example, may be 0.05 mm to 0.5 mm. Although examples of the method of fixing the second light reflecting layer to the support substrate include existing methods, such as a bonding method including a soldering method, room temperature welding method, bonding methods using adhesive tape, and bonding methods using wax bonding, it is desirable that a soldering method or a room temperature welding method be adopted from the viewpoint of ensuring conductivity. In a case of using a silicon semiconductor substrate, which is a conductive substrate, as the support substrate, it is desirable that a method in which bonding is possible at low temperatures of 400° C. or less be adopted in order to suppress warping due to differences in the thermal expansion coefficients. In a case of using a GaN substrate as the support substrate, the boding temperature may be 400° C. or more.

It is preferable that the first electrode have a single layer structure or a multilayer structure including at least one type of metal including alloys selected from a group including, for example, gold (Au), silver (Ag), palladium (Pd), platinum (Pt), nickel (Ni), titanium (Ti), vanadium (V), tungsten (W), chromium (Cr), aluminum (Al), copper (Cu), zinc (Zn), tin (Sn) and indium (In). More specifically, examples include, for example, Tl/Au, Ti/Al, Ti/Al/Au, Ti/Pt/AU, Ni/Au, Ni/Au/Pt, Ni/Pt, Ni/Pt, Pd/Pt, and Ag/Pd. The further to the front of the "/" a layer is in the multilayer structure, the further the layer is positioned to the active layer side. The same applies in the description below. It is possible to form the film of the first electrode, for example, with a PVD method, such as a vacuum deposition method or a sputtering method.

Examples of the transparent conductive material that configures the second electrode include indium tin oxide (ITO, including Sn doped $In_2O_3$, crystalline ITO and amorphous ITO), indium zinc oxide (IZO), IFO (F doped $In_2O_3$), tin oxide ($SnO_2$), ATO (Sb doped $SnO_2$), FTO (F doped $SnO_2$), and zinc oxide (including ZnO, Al doped ZnO and B doped ZnO). Alternatively, examples of the second electrode include transparent conductive films in which the mother layer is made from gallium oxide, titanium oxide, niobium oxide, nickel oxide or the like. However, although dependent on the arrangement state of the second light reflecting layer and the second electrode, the material that configures the second electrode is not limited to transparent conductive materials, and it is possible to use metals, such as palladium (Pd), platinum (Pt), nickel (Ni), gold (Au), cobalt (Co) and rhodium (Rh). The second electrode may be from at least one type of these materials. It is possible to form the film of the second electrode, for example, with a PVD method, such as a vacuum deposition method or a sputtering method.

A pad electrode may be formed on the first electrode or the second electrode in order to electrically connect an external electrode or a circuit. It is desirable that the pad electrode have a single layer structure or a multilayer structure including at least one type of metal selected from a group including titanium (Ti), aluminum (Al), platinum (Pt), gold (Au), nickel (Ni) and palladium (Pd). Alternatively, it is possible to configure the pad electrode with a multilayer structure, examples of which include a multilayer structure of Ti/Pt/Au, a multilayer structure of Ti/Au, a multilayer structure of Ti/Pd/Au, a multilayer structure of Ti/Ni/Au, or a multilayer structure of Ti/Ni/Au/Cr/Au. In a case of configuring the first electrode from an Ag layer or an Ag/Pd layer, it is preferable that a cover metal layer formed from, for example, Ni/TiW/Pd/TiW/Ni be formed on the surface of the first electrode, and, for example, a pad electrode formed from a multilayer structure of Ti/Ni/Au or a multilayer structure of Ti/Ni/Au/Cr/Au be formed on the cover metal layer.

The light reflecting layer (distributed Bragg reflector layer, DBR layer) is composed of, for example, a semiconductor multilayer film or a dielectric multilayer film. Examples of the dielectric material include, for example, oxides of Si, Mg, Al, Hf, Nb, Zr, Sc, Ta, Ga, Zn, Y, B, Ti or the like, a nitride (for example, AlN, AlGaN, GaN, Bn, or the like) or a fluoride. More specifically, examples include $SiO_2$, $TiO_2$, $Nb_2O_5$, $ZrO_2$, $Ta_2O_5$, ZnO, $Al_2O_3$, $HfO_2$, and AlN. It is possible to obtain a light reflecting layer by alternately layering two or more types of dielectric film formed from dielectric materials with different reflectivities from among these dielectric materials. For example, a multilayer film such as $SiO_2$/SiN, $SiO_2$/$Nb_2O_5$, $SiO_2$/$ZrO_2$ and $SiO_2$/AlN is preferable. In order to obtain the desired reflectivity, the material configuring each dielectric film, the film thickness, the number of layers and the like may be selected as appropriate. It is possible to adjust the thickness of each dielectric film, as appropriate, according to the material used, and thickness is determined according to the oscillation wavelength $\lambda$, and the reflectivity n with the oscillation wavelength $\lambda$ of the material used. More specifically, it is preferable that the thickness be an odd number multiple of $\lambda/(4n)$. For example, in a light emitting element with an oscillation wavelength $\lambda$ of 410 nm, in a case of configuring the light reflecting layer from $SiO_2$/$Nb_2O_5$, examples of the thickness include approximately 40 nm to 70 nm. Examples of the number of layers are two or more, and preferably approximately 5 to 20. Examples of the overall thickness of the light reflecting layer include, for example, approximately 0.6 μm to 1.7 μm.

Alternatively, it is desirable that the first light reflecting layer include a dielectric film including at least an N (nitrogen) atom, and it is more desirable that the dielectric layer including the N atom be the uppermost layer of the dielectric multilayer film. Alternatively, it is desirable that the first light reflecting layer be covered by a dielectric material layer including at least an N (nitrogen) atom. Alternatively, it is desirable that the surface of the first light reflecting layer be made a layer including at least an N (nitrogen) atom (below, referred to as a "surface layer", as a matter of convenience) by subjecting the surface of the first light reflecting layer to a nitriding treatment. The thickness of the dielectric film or the dielectric material layer including at least an N atom and the surface layer is preferably set to an odd numbered multiple of $\lambda/(4n)$. Examples of the material that configures the dielectric film or the dielectric material layer including at least an N atoms specifically include $SiN_y$ and $SiO_xN_y$. In this way, by forming the dielectric film or dielectric material layer including at least an N atom, and the surface layer, when the compound semiconductor layer that covers the first light reflecting layer is formed, it is possible to reduce shifting of the crystal axis of the compound semiconductor layer that covers the first light reflecting layer and the crystal axis of the substrate for manufacturing a light emitting element, and possible to improve the quality of the layered structure body that is a resonator.

The size and shape of the light reflecting layer is not particularly limited, as long as the layer covers the element region. Examples of the planar shape of the opening provided in the element region, the first light reflecting layer, the second light reflecting layer, and the current constriction layer similarly include, specifically, a circle, an ellipse, a rectangle, and a polygon (triangle, quadrangle, hexagon or the like). Examples of the planar shape of the first electrode include a ring shape. It is desirable that the planar shape of the opening provided in the element region, the first light reflecting layer, the second light reflecting layer, and the current constriction layer, the planar shape of the inside ring portion of the annular first electrode, and further the planar shape of the convexity described later be similar shapes. In the case of a circular shape, it is preferable that the diameter be approximately 2 μm to 70 μm.

It is possible for the light reflecting layer to be formed based on an existing method, and specific examples include PVD methods, such as a vacuum deposition method, a sputtering method, a reactive sputtering method, an ECR plasma sputtering method, a magnetron sputtering method, an ion beam assisted deposition method, an ion plating method, a laser ablation method; various CVD methods; coating methods, such as a spray method, a spin coating method, and a dipping method; a method in which two or more of these methods are combined; and a method combining these methods with one or more of any of a complete or partial preprocessing, irradiation of inactive gas (Ar, He, Xe or the like) or plasma, irradiation of oxygen gas, ozone gas and plasma, oxidation treatment (heat treatment), and exposure treatment.

Examples of the material that configures the convexity (mask layer for selective growth), include semiconductor oxides or semiconductor nitrides such as $SiO_2$, SiN, SiON; $Nb_2O_5$, $Ta_2O_5$, $ZrO_2$, AlN, $Al_2O_3$; metals or high melting point metals such as Ti, W, Ni, Au, and Pt or an alloy in which the composition of these metals is appropriately adjusted (for example, TiW, TiWCr, TiWNi, NiCr, TiNiCr, or alloys of these alloys and Au, or of these alloys and Pt, or the like); high melting point metal (alloy) oxides; high melting point metal (alloy) nitrides; a multilayer structure in which materials different from one another, metals, alloys, alloy oxides, alloy nitrides are combined (for example, a layered structure of, from below, a silicon oxide layer and a silicon nitride layer); and a resist material. Examples of the method of forming the convexity include physical vapor-phase growth methods (PVD method), such as a sputtering method, or a chemical vapor-phase growth method (CVD method), and a combination of a coating method and a lithography technology or an etching technology. Removal of the convexity depends on the material that configures the convexity, and a wet etching method may be adopted, a dry etching method may be adopted, or an asking technology may be used. The convexity may have a one dimensional arrangement, such as a band-shape, or may have a two-dimensional arrangement having a curved shape (circle, ellipse or the like) that is dotted or scattered, or a combination of curves, a combination of cures and line segments, or a polygonal shape (triangle, quadrangle, hexagon or the like).

The side surface or exposed surface of the layered structure body may be covered with an insulating film. Forming the insulating film may be performed based an existing method. It is preferable that the refractive index of the material that configures the insulating film be lower than the refractive index of the material that configures the layered structure body. Examples of the material that configures the insulating film include a $SiO_x$-based material including $SiO_2$, $SiN_y$-based material, a $SiO_xN_y$-based material, $Ta_2O_5$, $ZrO_2$, AlN, $Al_2O_3$, and $Ga_2O_3$, or an organic material, such as a polyimide resin. Examples of the method of forming the insulating film include PVD methods, such as a vacuum deposition method or a sputtering method, or a CVD method, or the film may be formed based on a coating method.

Embodiment 1

Embodiment 1 relates to a method of manufacturing a light emitting element according to the first embodiment of the disclosure.

The light emitting element obtained by the method of manufacturing a light emitting element of Embodiment 1 shown in the schematic partial end face view in FIG. 1A or the light emitting element of Embodiments 2 to 3 described later includes (A) a layered structure body 20 formed by layering a first compound semiconductor layer 21 formed from a GaN-based compound semiconductor, which has a first surface 21a and a second surface 21b opposing the first surface 21a, an active layer (light emitting layer) 23 formed from a GaN-based compound semiconductor, that contacts the second surface 21b of the first compound semiconductor layer 21, and a second compound semiconductor layer 22 formed from a GaN-based compound semiconductor, which has a first surface 22a and a second surface 22b opposing the first surface 22a, in which the first surface 22a contacts the active layer 23; (B) a first electrode 31 and a first light reflecting layer 41; and (C) a second electrode 32 and a second light reflecting layer 42 formed from a multi layer film formed on the second surface 22b of the second compound semiconductor layer 22.

In the light emitting element of Embodiment 1, or Embodiments 2 and 3 described later, the first electrode 31 is formed on at least the first surface 21a of the first compound semiconductor layer 21, and the first light reflecting layer 41 formed from a multilayer film is formed on the first surface 21a of the first compound semiconductor layer 21.

The light emitting element of Embodiment 1, or Embodiments 2 and 3 described later is specifically formed from a surface-emitting laser element (vertical resonator laser, VCSEL) that emits light from the top surface of the first compound semiconductor layer 21 via the first light reflecting layer 41.

In the light emitting element of Embodiment 1, or Embodiments 2 and 3 described later, the current constriction layer 24 formed from an insulating material, such as $SiO_2$, is formed between the second electrode 32 and the second compound semiconductor layer 22. A circular opening 24A is formed in the current constriction layer 24, and the second compound semiconductor layer 22 is exposed in the bottom portion of the opening 24A. The second electrode 32 is formed from over the second surface 22b of the second compound semiconductor layer 22 to over the current constriction layer 24, and the second light reflecting layer 42 is formed on the second electrode 32. A pad electrode 33 for electrically connecting an external electrode or a circuit is connected on edge portion of the second electrode 32. In the light emitting element of Embodiment 1, or Embodiment 2 described later, the planar shape of the element region is a circle, and the planar shape of the opening 24A provided in the first light reflecting layer 41, the second light reflecting layer 42, and the current constriction layer 24 is also a circle. Meanwhile, the planar shape of the first electrode 31 is annular (ring-like). Although the first light reflecting layer 41 and the second light reflecting layer 42 has a multilayer structure, for the sake of simplicity in the drawings, the layers are depicted by one layer. Forming the current constriction layer 24 may not be necessary.

In the light emitting element of Embodiment 1, the first light reflecting layer 41 and the first electrode 31 are separated, that is, an offset is provided, and the separation distance is within 1 mm, specifically, for example, an average of 0.05 mm.

In the light emitting element of Embodiment 1, or Embodiments 2 and 3 described later, the second light reflecting layer 42 is fixed based on a soldering method to the support substrate 26 formed from a silicon semiconductor substrate via a bonding layer 25 formed from a solder layer including a gold (Au) layer or a tin (Sn) layer.

In the light emitting element of Embodiment 1, or Embodiments 2 and 3 described later, light generated in the active layer 23 is emitted to the outside via the first light reflecting layer 41. $S_1 > S_2$ is satisfied, where the area of a part of the first light reflecting layer 41 that contacts the first surface 21a of the first compound semiconductor layer 21 (part of the first light reflecting layer 41 opposing the second light reflecting layer 42) is $S_1$, and the area of a part of the second light reflecting layer 42 opposing the second surface of the second compound semiconductor layer 22 (part of the second light reflecting layer 42 opposing the first light reflecting layer 41) is $S_2$. The distance from the first light reflecting layer 41 to the second light reflecting layer 42 is 0.15 μm or more and 50 μm or less, and, specifically, is, for example, 10 μm.

The first compound semiconductor layer 21 is formed from an n-GaN layer, the active layer 23 is formed from a quintuple multiple quantum well structure in which an $In_{0.04}Ga_{0.26}N$ layer (barrier layer) and an $In_{0.16}Ga_{0.24}N$ layer (well layer) are layered, and the second compound semiconductor layer 22 is formed from a p-GaN layer. The first electrode 31 is formed from Ti/Pt/Au, the second electrode 32 is formed from a transparent conductive material, specifically, ITO, the pad electrode 33 is formed from Ti/Pd/Au, the first light reflecting layer 41 and the second light reflecting layer 42 are formed from a layer structure of an SiN layer and an $SiO_2$ layer (total number of layers of dielectric film: 20 layers).

Below, the method of manufacturing a light emitting element of Embodiment 1 will be described with reference to FIGS. 3A, 3B, 3C, 4A, 4B, 5A and 5B which are schematic partial end face views of a layered structure body.

Step-100

First, a first light reflecting layer 41 formed from a multilayer film and having a convex shape is formed on the substrate for manufacturing a light emitting element 11. Specifically, a patterned first light reflecting layer 41 formed from a multilayer film is formed based on an existing method, on the substrate for manufacturing a light emitting element 11 formed from a GaN substrate. In this way, it is possible to obtain the structure shown in FIG. 3A. The shape of the first light reflecting layer 41 is a disk-shape. However, the shape of the first light reflecting layer 41 is not limited thereto.

Step-110

Next, a layered structure body 20 in which a first compound semiconductor layer 21 formed from a GaN-based compound semiconductor, which has a first surface 21a and a second surface 21b opposing the first surface 21a, an active layer 23 formed from a GaN-based compound semiconductor, that contacts the second surface 21b of the first compound semiconductor layer 21, and a second compound semiconductor layer 22 formed from a GaN-based compound semiconductor, which has a first surface 22a and a second surface 22b opposing the first surface 22a, and in which the first surface 22a contacts the active layer 23 are layered is formed on the substrate for manufacturing a light emitting element 11 including the first light reflecting layer 41. Specifically, it is possible to obtain a layered structure body 20 by forming the first compound semiconductor layer 21 formed from n-GaN by lateral direction growth using a method that causes epitaxial growth in the lateral direction, such as an ELO method, and forming the active layer 23 and the second compound semiconductor layer 22 thereupon, based on an epitaxial growth method. Then, the current constriction layer 24 having an opening 24A is formed based on an existing method, on the second surface 22b of the second compound semiconductor layer 22 (refer to FIG. 3B).

Step-120

Thereafter, the second electrode 32 and the second light reflecting layer 42 formed from a multilayer film are formed on the second surface 22b of the second compound semiconductor layer 22. Specifically, for example, the second electrode 32 is formed from over the second surface 22b of the second compound semiconductor layer 22 to over the current constriction layer 24 based on a lift-off method and the pad electrode 33 is further formed from over the second electrode 32 to over the current constriction layer 24 based on an existing method. In this way, it is possible to obtain the structure shown in FIG. 3C. Thereafter, the second light reflecting layer 42 is formed from over the second electrode 32 to over the pad electrode 33 based on an existing method. In this way, it is possible to obtain the structure shown in FIG. 4A.

Step-130

Thereafter, the second light reflecting layer 42 is fixed to the support substrate 26 via a bonding layer 25. In this way, it is possible to obtain the structure shown in FIG. 4B.

Step-140

Next, the substrate for manufacturing a light emitting element 11 is removed, and the first surface 21a of the first compound semiconductor layer 21 and the first light reflecting layer 41 are exposed. Specifically, first the thickness of the substrate for manufacturing a light emitting element 11 is thinned based on a mechanical polishing method, then the remainder of the substrate for manufacturing a light emitting element 11 is removed based on a CMP method. In this way, the first surface 21a of the first compound semiconductor layer 21 and the first light reflecting layer 41 are exposed, and it is possible to obtain the structure shown in FIG. 5A.

Step-150

Thereafter, the first surface 21a of the first compound semiconductor layer 21 is etched. Specifically the exposed first surface 21a of the first compound semiconductor layer 21 is etched based on an RIE method (refer to FIG. 5B). Thereby, a rough surface region 21A is formed on the first surface 21a of the first compound semiconductor layer 21.

Step-160

Next, the first electrode 31 is formed on at least the etched first surface 21a of the first compound semiconductor layer 21. Specifically, the first electrode 31 is formed on the etched first surface 21a of the first compound semiconductor layer 21 (on the rough surface region 21A) based on an existing method. In this way, it is possible to obtain the light emitting element of Embodiment 1 having the structure shown in FIG. 1A.

Here, the value of the surface roughness Ra of the surface of the first compound semiconductor layer 21 in the interface between the first light reflecting layer 41 and the first surface 21a of the first compound semiconductor layer 21 (below, referred to as a "flat surface 21B", as a matter of convenience) is $3 \times 10^{-9}$ m or less, and the value of the surface roughness Ra of the rough surface region 21A exceeds the value of the surface roughness Ra of the flat surface 21B. Specifically, the value of the surface roughness Ra of the flat surface 21B is 0.2 nm, and the value of the surface roughness Ra of the rough surface region 21A is 3.1 nm.

$R_2/R_1 \leq 1$ is satisfied, where the contact resistance value in the flat surface 21B is $R_1$ and the contact resistance value in the rough surface region 21A is $R_2$. Specifically, the IV curve in the flat surface 21B is a Schottky-type, and the IV curve in the rough surface region 21A is an ohmic-type.

Step-170

Thereafter, the light emitting element is separated by performing so-called element separation, and the exposed surface of the side surface of the layered structure body is covered with an insulating film formed from, for example, $SiO_2$. Thereafter, a terminal or the like for connecting the first electrode 31 and the pad electrode 33 to an external circuit or the like is formed based on an existing method, and the light emitting element of Embodiment 1 is completed by packaging or sealing.

In the method of manufacturing a light emitting element of Embodiment 1, the substrate for manufacturing a light emitting element is removed in a state in which the first light reflecting layer is formed. Therefore, the first light reflecting layer functions as one type of stopper when removing the substrate for manufacturing a light emitting element, it is possible to suppress the occurrence of variations in the removal of the substrate for manufacturing a light emitting element on the surface of the substrate for manufacturing a light emitting element, and, further, variations in the thickness of the first compound semiconductor layer, and it is possible to attain results enabling achievement of uniformity in the length of the resonator and stability in the characteristics of the obtained light emitting element. Because the surface (flat surface) of the first compound semiconductor layer in the interface between the first light reflecting layer and the first compound semiconductor layer is flat, it is possible to suppress scattering of light by the flat surface to a minimal level. Since the first electrode is formed on the rough surface region, it is possible to suppress a rise in the contact resistance between the first compound semiconductor layer and the first electrode.

In the example of the light emitting element described above and shown in FIG. 1A, the end portion of the first electrode 31 is separated from the first light reflecting layer 41. Meanwhile, in the example of the light emitting element shown in FIG. 1B, the end portion of the first electrode 31 contacts the first light reflecting layer 41.

Figure 2:
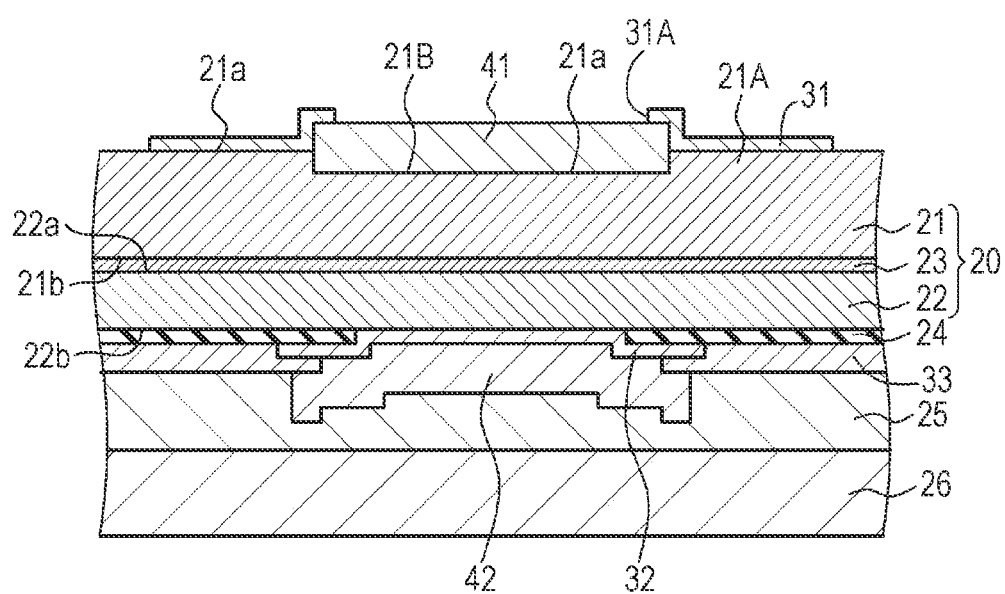
FIG. 2 is a schematic partial end face view of a modification example of the light emitting element of Embodiment 1.
Figure 3A:
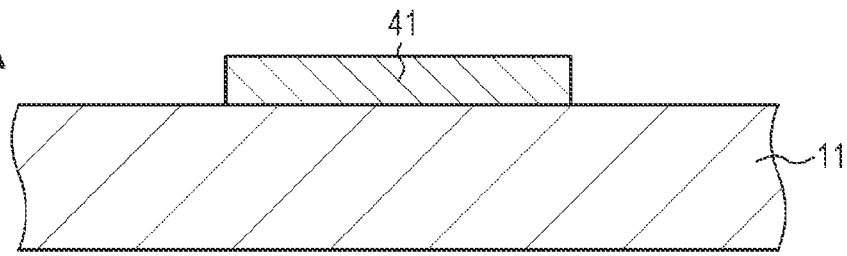
FIGS. 3A, 3B and 3C are schematic partial end face views of a layered structure body or the like for illustrating a method of manufacturing a light emitting element of Embodiment 1.
Figure 3B:
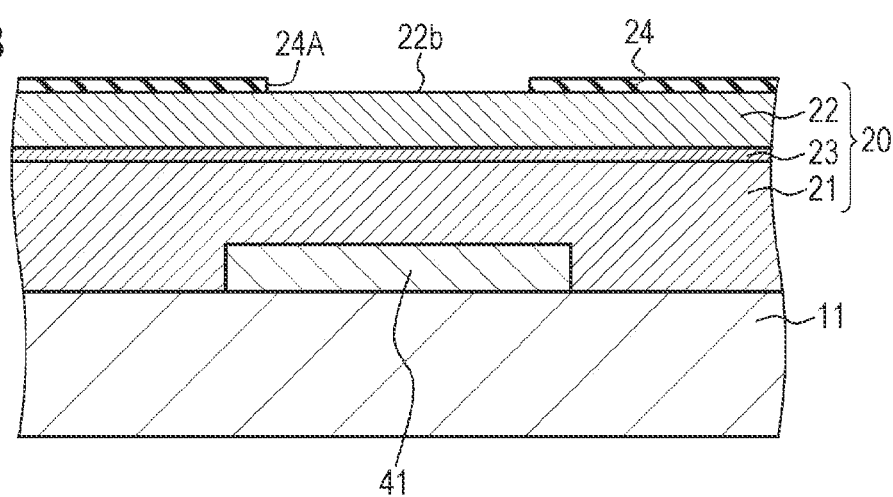
Figure 3C:
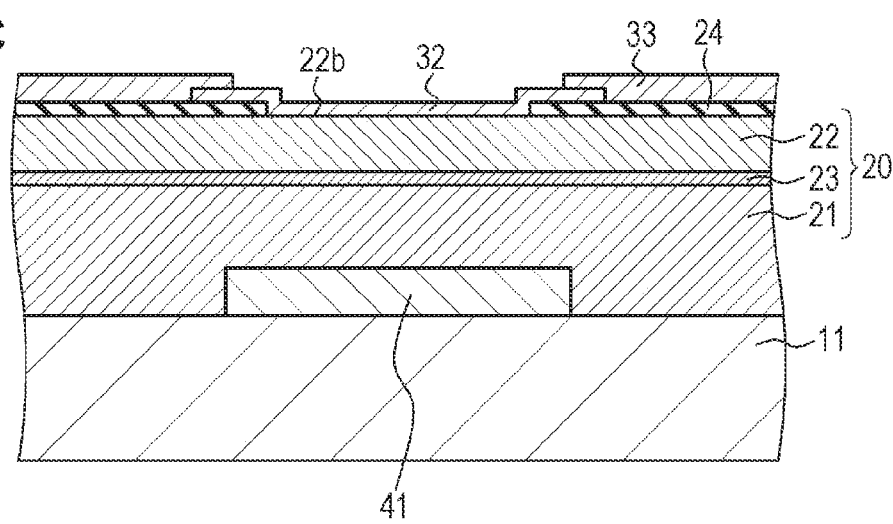
Figure 4A:
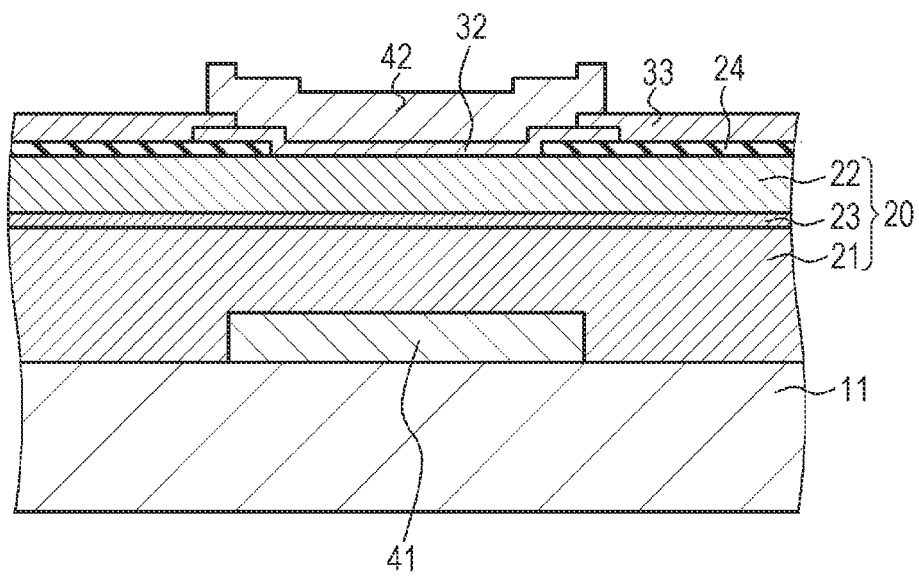
FIGS. 4A and 4B are schematic partial end face views of the layered structure body or the like for illustrating the method of manufacturing a light emitting element of Embodiment 1 continuing from FIG. 3C.
Figure 4B:
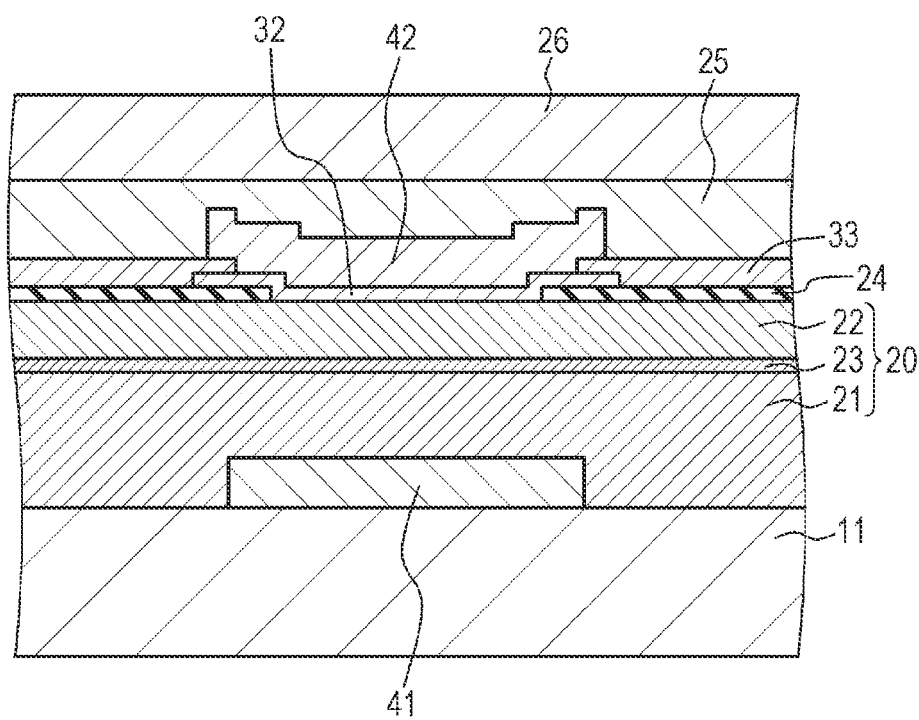
Figure 5A:
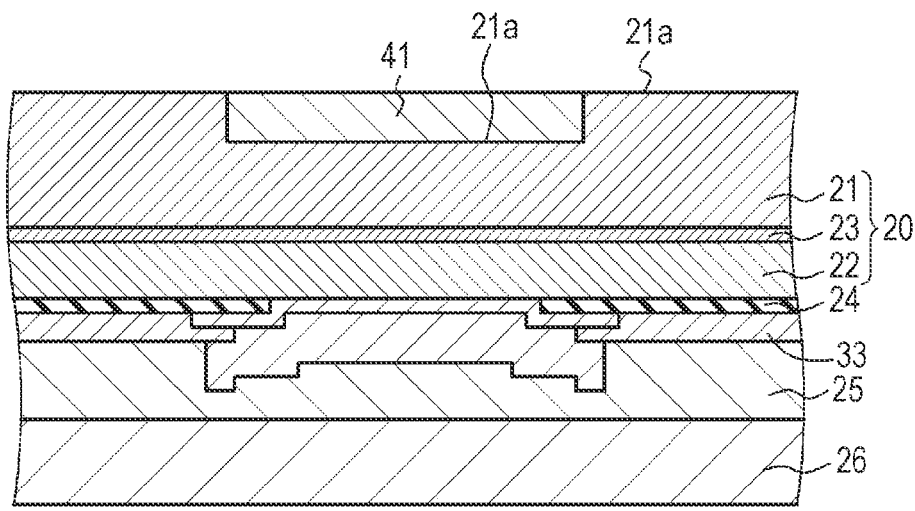
FIGS. 5A and 5B are schematic partial end face views of the layered structure body or the like for illustrating the method of manufacturing a light emitting element of Embodiment 1, continuing from FIG. 4B.
Figure 5B:
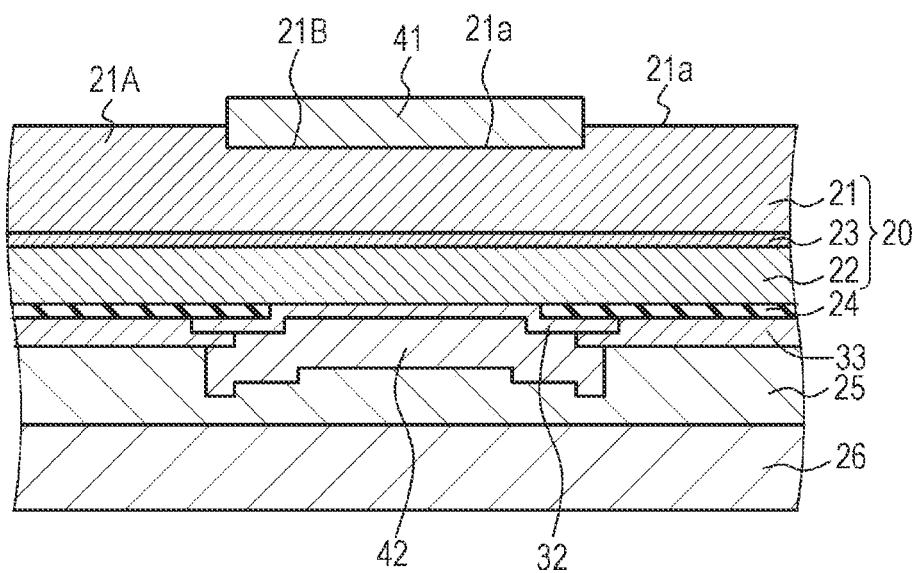

In the example of the light emitting element shown in FIG. 2, the end portion of the first electrode 31 is formed over the edge portion of the first light reflecting layer 41. In a case in which the first electrode 31 is extended onto the edge portion of the first light reflecting layer 41, an opening portion 31A, for example, an opening portion 31A with a diameter of 5 μm to 50 μm is formed in the first electrode 31 such that basic mode light of laser oscillation is absorbed as little as possible. The same applies in the description below. Alternatively, it is possible to use a configuration in which the first surface 21a in the rough surface region 21A is positioned further downwards than the flat surface 21B.

Embodiment 2

Figure 6A:
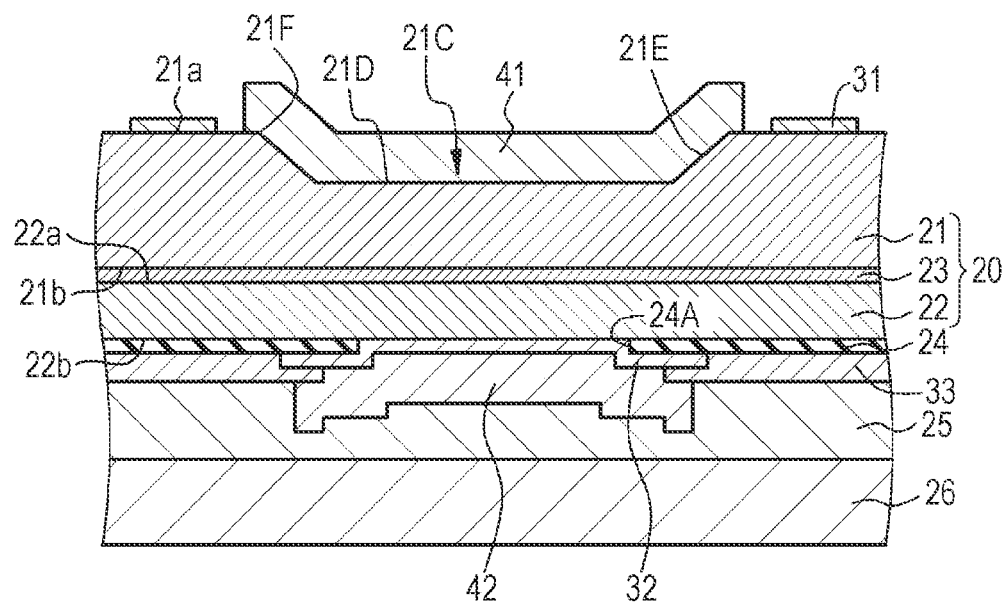
FIGS. 6A and 6B are both schematic partial end face views of a light emitting element and a modification example thereof of Embodiment 2.

Embodiment 2 relates to a method of manufacturing a light emitting element according to the second embodiment of disclosure and to the light emitting element of the disclosure. Although FIG. 6A shows a schematic partial end face view of the light emitting element of Embodiment 2, the configuration and structure of the light emitting element of Embodiment 2 is substantially the same as the configuration and structure of the light emitting element of Embodiment 1, except that the configuration and structure of the first light reflecting layer 41, the first electrode 31 and the periphery thereof are slightly different. Therefore, in the light emitting element of Embodiment 2, the configuration and structure of the first light reflecting layer 41, the first electrode 31 and the periphery thereof will be exclusively described.

In the light emitting element of Embodiment 2 shown by the schematic partial end face view in FIG. 6A, a concavity 21C with a forward tapered side surface 21E is formed on the first surface 21a of the first compound semiconductor layer 21. That is, the bottom surface 21D of the concavity 21C positioned on the active layer side is smaller than the opening portion 21F position on the first surface 21a of the first compound semiconductor layer 21. The first light reflecting layer 41 is formed on at least the concavity 21C, and the first electrode 31 is formed on at least the first surface 21a of the first compound semiconductor layer 21. The end portion of the first electrode 31 is separated from the first light reflecting layer 41.

Below, the method of manufacturing a light emitting element of Embodiment 2 will be described with reference to FIGS. 13A, 13B, 13C, 14A, 14B, 15A, 15B, 16 which are schematic partial end face views of a layered structure body.

Step-200

First, a convexity (mask layer for selective growth) 51 formed from a material different from the material that configures the first compound semiconductor layer 21 is formed on the substrate for manufacturing a light emitting element 11. Specifically, a patterned convexity 51 formed from $SiO_2$ is formed, based, for example, on an existing method, such as an etch back method, on the substrate for manufacturing a light emitting element 11 formed from a GaN substrate. The top surface 51A of the convexity 51 is smaller than the bottom surface 51B of the convexity 51. In this way, it is possible to obtain the structure shown in FIG. 13A. The shape of the convexity 51 is a truncated cone. However, the shape of the convexity 51 is not limited thereto.

Step-210

Next, a layered structure body 20 in which a first compound semiconductor layer 21 formed from a GaN-based compound semiconductor, which has a first surface 21a and a second surface 21b opposing the first surface 21a, an active layer 23 formed from a GaN-based compound semiconductor, that contacts the second surface 21b of the first compound semiconductor layer 21, and a second compound semiconductor layer 22 formed from a GaN-based compound semiconductor, which has a first surface 22a and a second surface 22b opposing the first surface 22a, in which the first surface 22a contacts the active layer 23 are layered is formed on the substrate for manufacturing a light emitting element 11 including the convexity 51. Specifically, it is possible to obtain a layered structure body 20 by forming the first compound semiconductor layer 21 formed from n-GaN by lateral direction growth using a method that causes epitaxial growth in the lateral direction, such as an ELO method, and forming the active layer 23 and the second compound semiconductor layer 22 thereupon, based on an epitaxial growth method. Then, the current constriction layer 24 having an opening 24A is formed, based on an existing method, on the second surface 22b of the second compound semiconductor layer 22 (refer to FIG. 13B).

Step-220

Thereafter, the second electrode 32 and the second light reflecting layer 42 formed from a multilayer film are formed on the second surface 22b of the second compound semiconductor layer 22. Specifically, for example, the second electrode 32 is formed from over the second surface 22b of the second compound semiconductor layer 22 to over the current constriction layer 24 based on a lift-off method and the pad electrode 33 is further formed from over the second electrode 32 to over the current constriction layer 24 based on an existing method. In this way, it is possible to obtain the structure shown in FIG. 13C. Thereafter, the second light reflecting layer 42 is formed from over the second electrode 32 to over the pad electrode 33 based on an existing method. In this way, it is possible to obtain the structure shown in FIG. 14A.

Step-230

Thereafter, the second light reflecting layer 42 is fixed to the support substrate 26 via a bonding layer 25. In this way, it is possible to obtain the structure shown in FIG. 14B.

Step-240

Next, the substrate for manufacturing a light emitting element 11 is removed, and the first surface 21a of the first compound semiconductor layer 21 and the convexity 51 are exposed. Specifically, the thickness of the substrate for manufacturing a light emitting element 11 is thinned based on a mechanical polishing method, then the remainder of the substrate for manufacturing a light emitting element 11 is removed based on a CMP method. In this way, the first surface 21a of the first compound semiconductor layer 21 and the convexity 51 are exposed, and it is possible to obtain the structure shown in FIG. 15A.

Step-250

Thereafter, the convexity 51 is removed, the first light reflecting layer 41 formed from a multilayer film is formed on at least that part of the first surface 21a of the first compound semiconductor layer 21 from which the convexity 51 is removed, and the first electrode 31 is formed on the part of the first surface 21a of the first compound semiconductor layer 21 on which the first electrode 31 is to be formed.

Specifically, removal of the convexity 51, formation of the first light reflecting layer 41 and formation of the first electrode 31 are performed in that order. That is, first, the convexity 51 formed from $SiO_2$ is removed based on an existing method. In this way, it is possible to obtain the structure shown in FIG. 15B. A concavity 21C with a forward tapered side surface 21E is formed on the first surface 21a of the first compound semiconductor layer 21. That is, the bottom surface 21D of the concavity 21C positioned on the active layer side is smaller than the opening portion 21F positioned on the first surface 21a of the first compound semiconductor layer 21. Next, the first light reflecting layer 41 is formed at least in the concavity 21C. Specifically, the patterned first light reflecting layer 41 formed from a multilayer film is formed, based on an existing method, from the concavity 21C to over the first surface 21a of the substrate for manufacturing a light emitting element 11. In this way, it is possible to obtain the structure shown in FIG. 16. The first light reflecting layer 41 is formed from the inner portion of the concavity 21C to over the first surface 21a of the first compound semiconductor layer 21. The external shape of the first light reflecting layer 41 is a circle. Thereafter, the first electrode 31 is formed, based on an existing method, on the part of the first surface 21a of the first compound semiconductor layer 21 on which the first electrode 31 is to be formed. In this way, it is possible to obtain the light emitting element of Embodiment 2 having the structure shown in FIG. 6A.

Step-260

Thereafter, the light emitting element is separated by performing so-called element separation, and the exposed surface of the side surface of the layered structure body is covered with an insulating film formed from, for example, $SiO_2$. Thereafter, a terminal or the like for connecting the first electrode 31 and the pad electrode 33 to an external circuit or the like is formed based on an existing method, and the light emitting element of Embodiment 2 is completed by packaging or sealing.

In the method of manufacturing a light emitting element of Embodiment 2, the substrate for manufacturing a light emitting element is removed in a state in which the convexity (mask layer for selective growth) is formed. Therefore, the convexity functions as one type of stopper when removing the substrate for manufacturing a light emitting element, as a result it is possible to suppress the occurrence of variations in the removal of the substrate for manufacturing a light emitting element on the surface of the substrate for manufacturing a light emitting element, and, further, variations in the thickness of the first compound semiconductor layer, and it is possible to attain results enabling achievement of uniformity in the length of the resonator and stability in the characteristics of the obtained light emitting element.

Figure 6B:
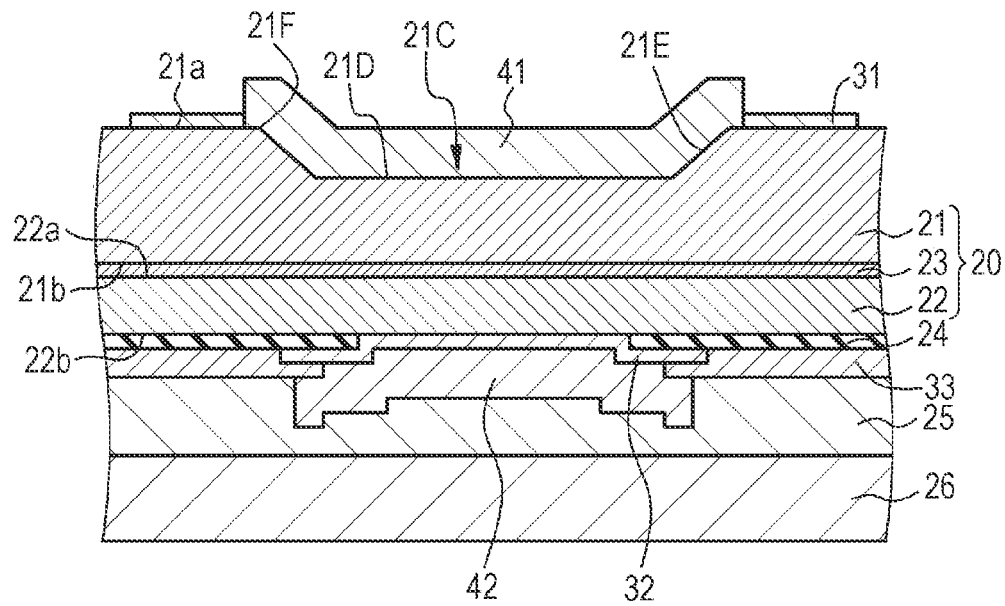
Figure 7A:
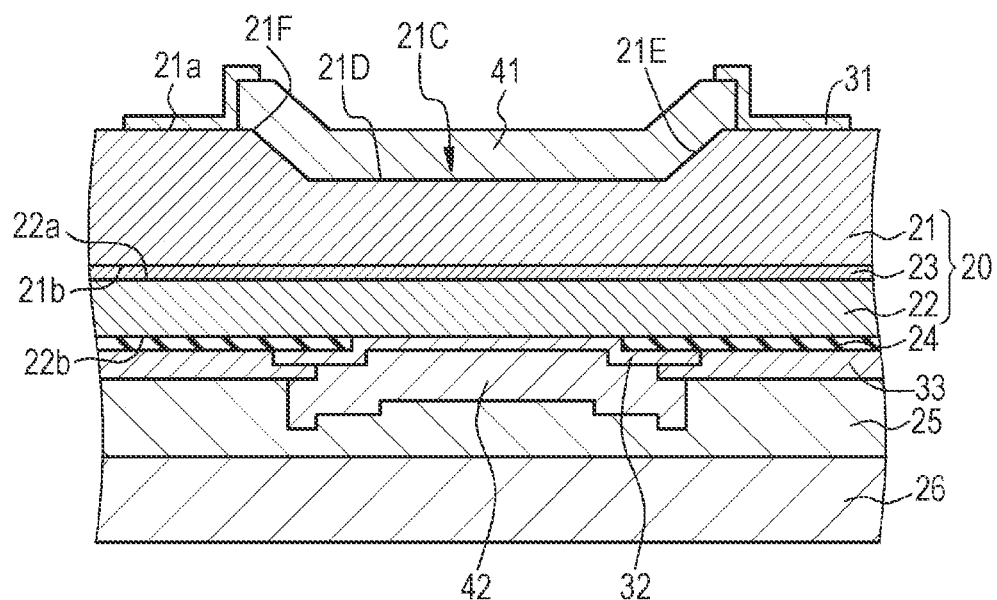
FIGS. 7A and 7B are both schematic partial end face views of a modification example of the light emitting element of Embodiment 2.

In the example of the light emitting element described above and shown in FIG. 6A, the end portion of the first electrode 31 is separated from the first light reflecting layer 41. Meanwhile, in the example of the light emitting element shown in FIG. 6B, the end portion of the first electrode 31 contacts the first light reflecting layer 41. In the example of the light emitting element shown in FIG. 7A, the end portion of the first electrode 31 is formed over the edge portion of the first light reflecting layer 41.

Figure 7B:
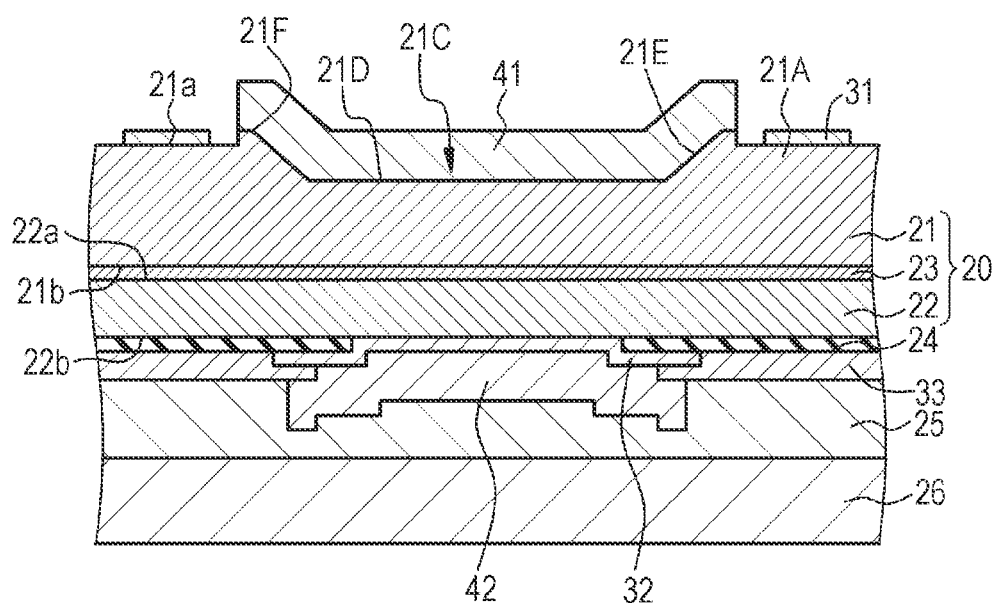
Figure 8A:
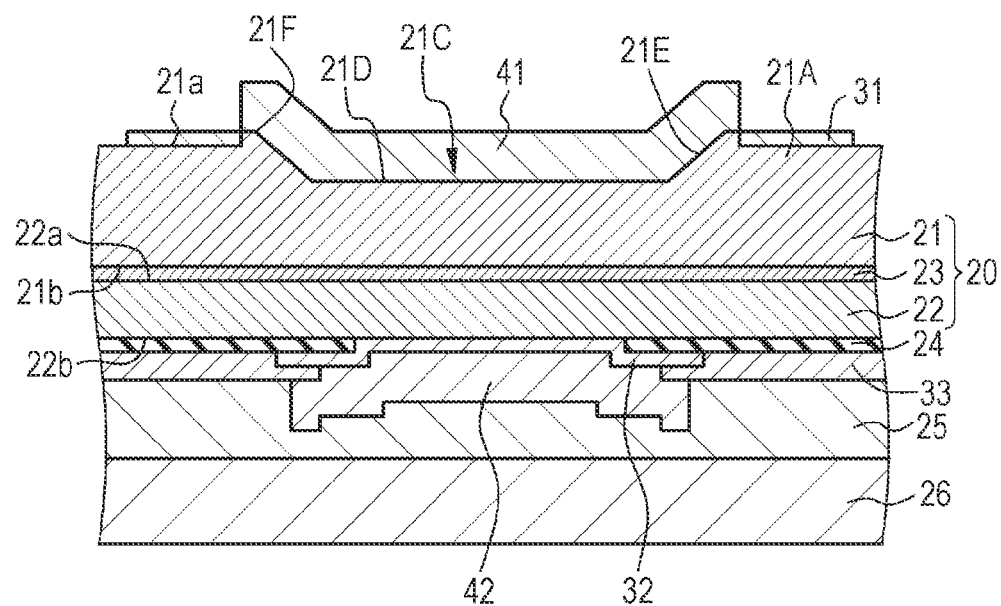
FIGS. 8A and 8B are both schematic partial end face views of a modification example of the light emitting element of Embodiment 2.
Figure 8B:
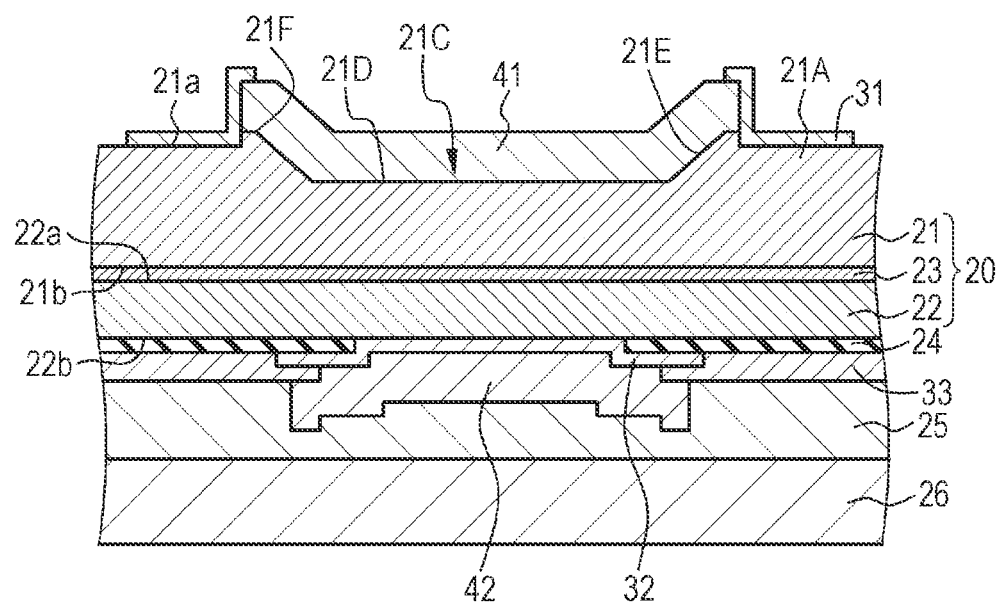
Figure 9A:
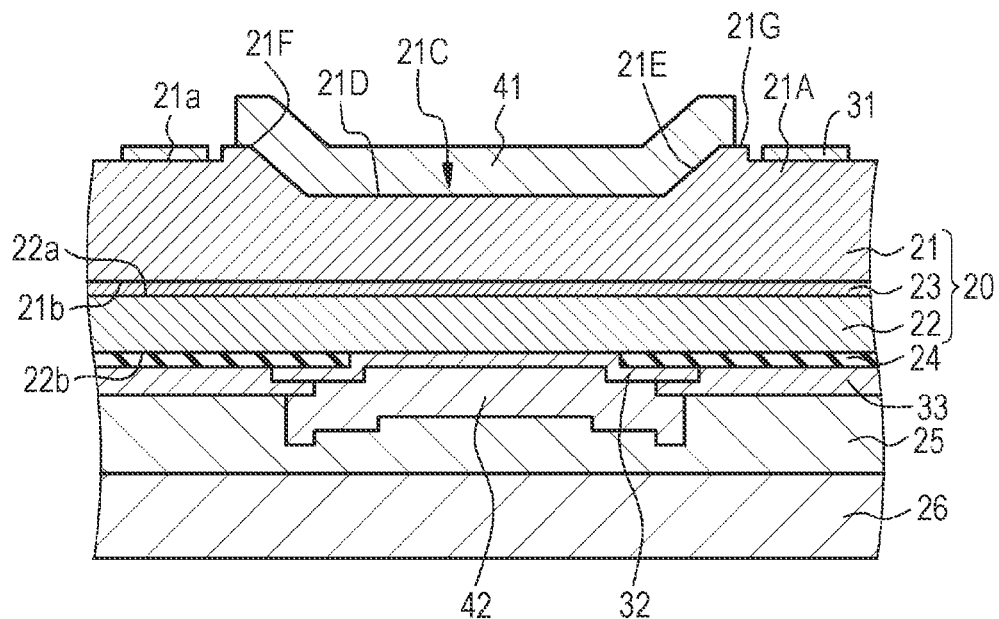
FIGS. 9A and 9B are both schematic partial end face views of a modification example of the light emitting element of Embodiment 2.
Figure 9B:
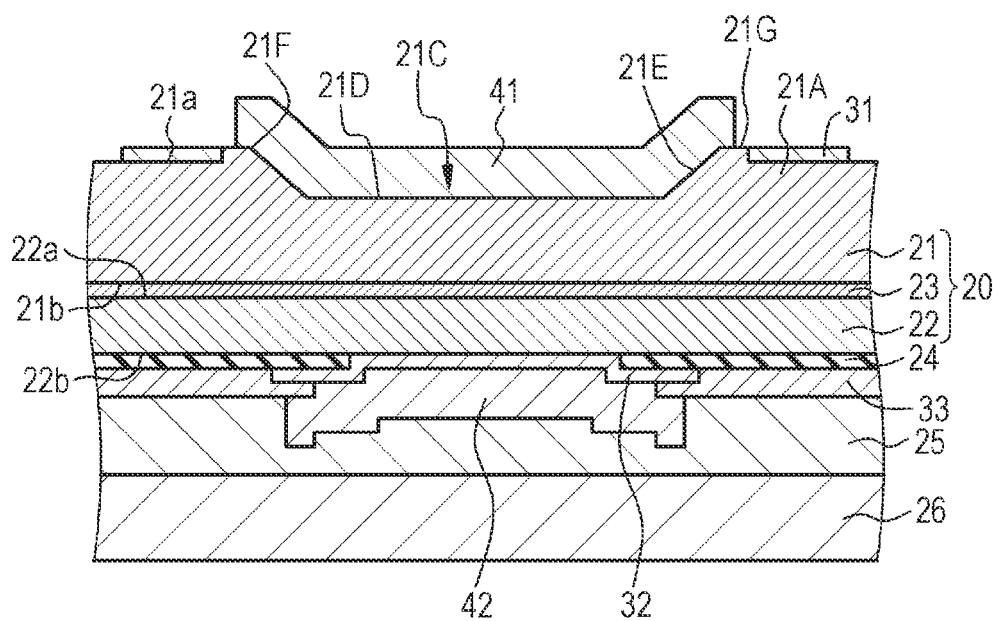
Figure 10A:
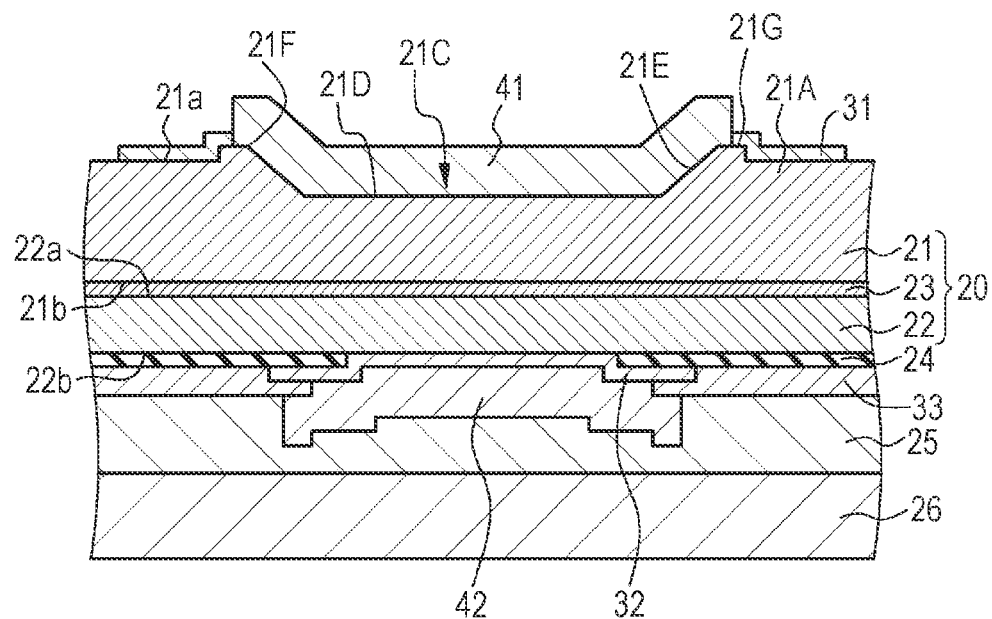
FIGS. 10A and 10B are both schematic partial end face views of a modification example of the light emitting element of Embodiment 2.
Figure 10B:
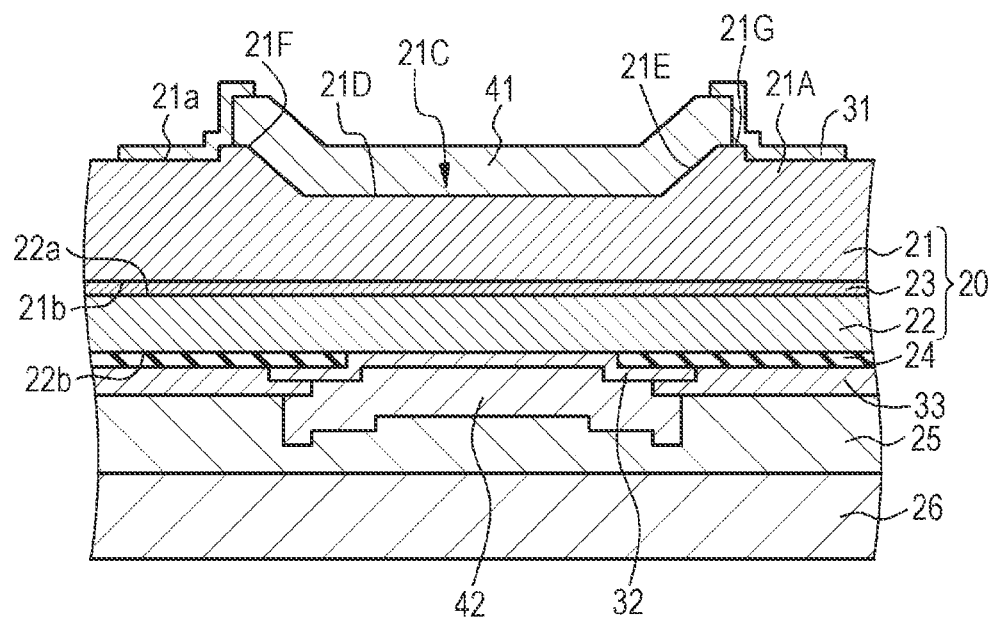
Figure 11A:
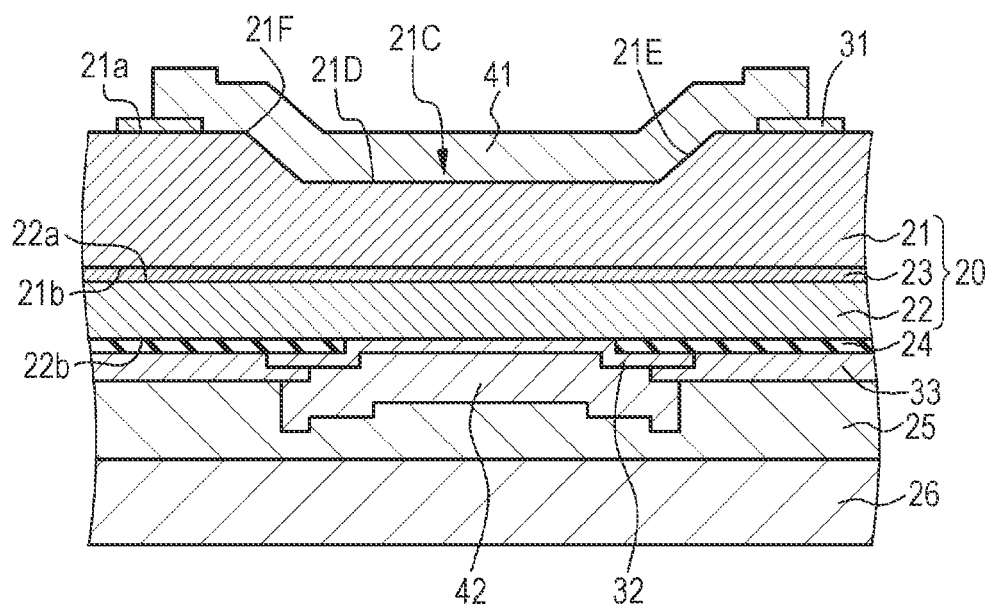
FIGS. 11A and 11B are both schematic partial end face views of a modification example of the light emitting element of Embodiment 2.
Figure 11B:
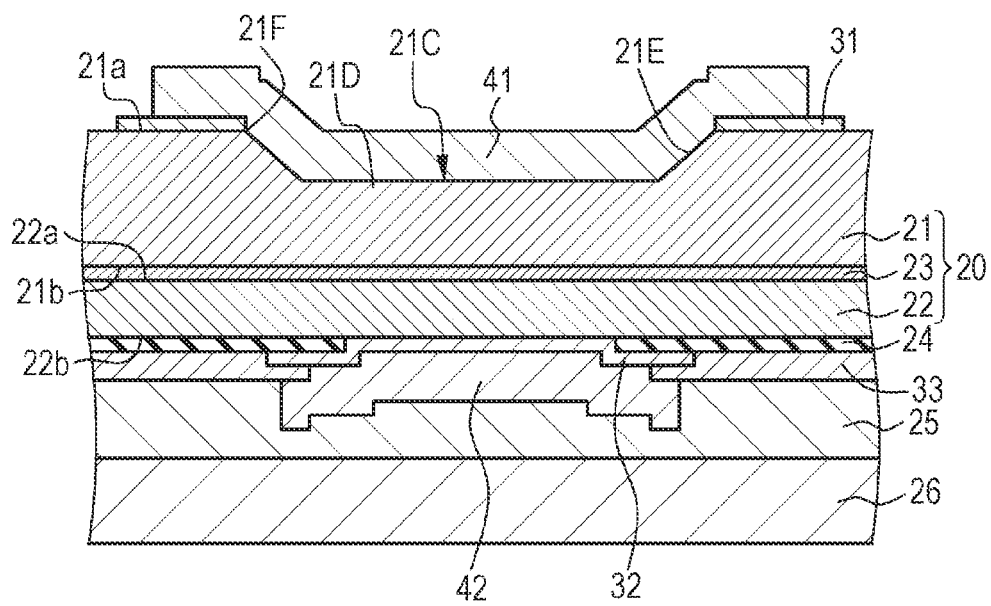
Figure 12A:
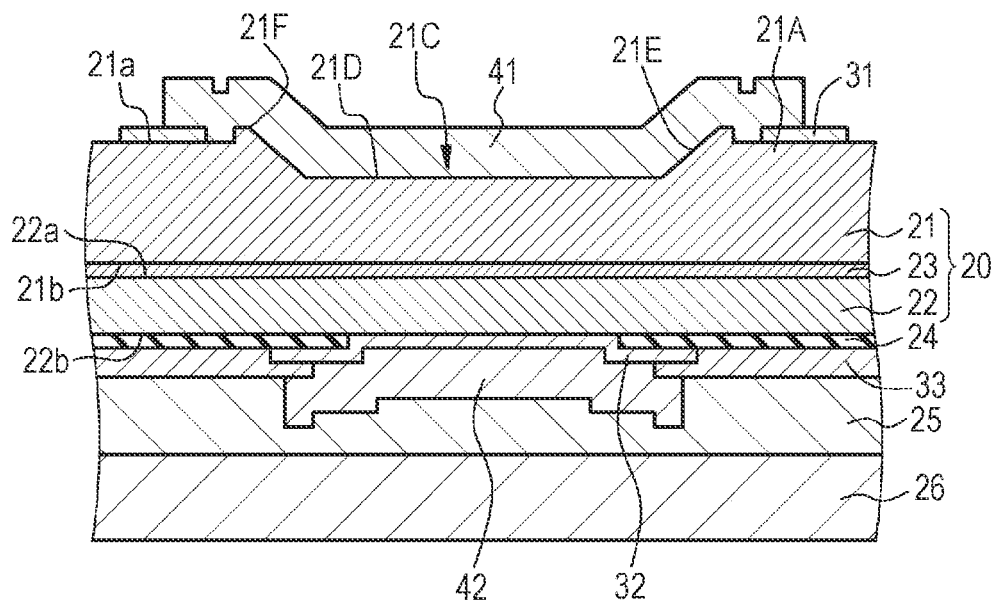
FIGS. 12A and 12B are both schematic partial end face views of a modification example of the light emitting element of Embodiment 2.
Figure 12B:
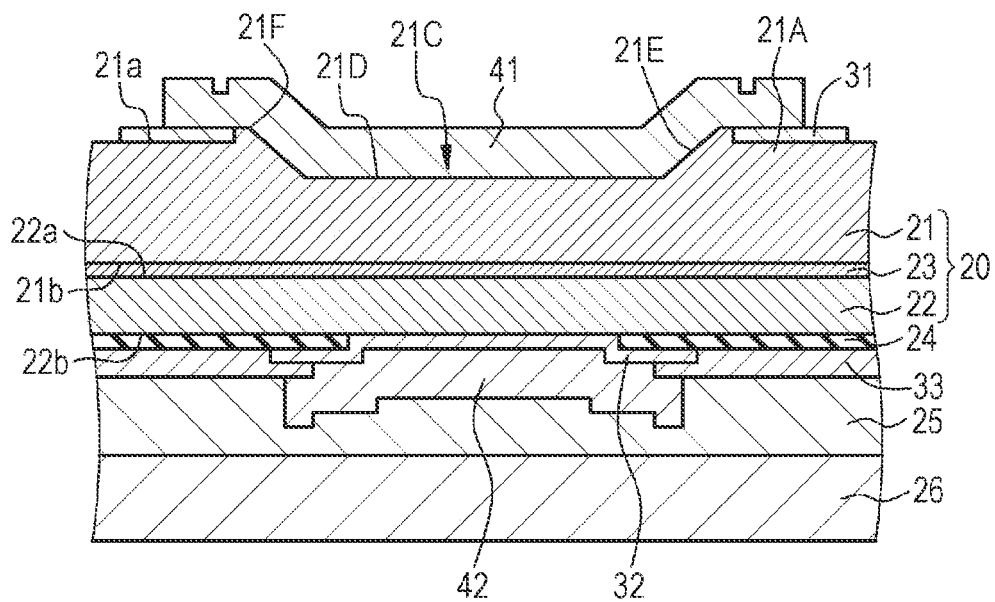
Figure 13A:
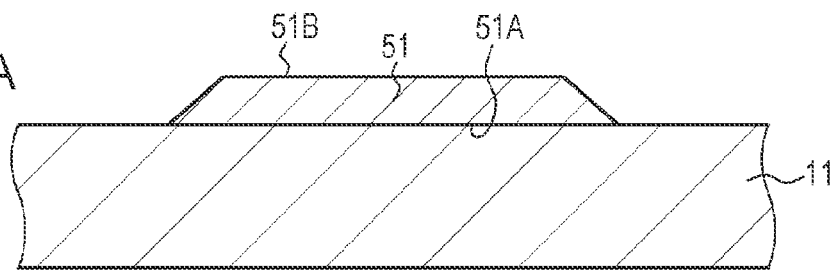
FIGS. 13A, 13B and 13C are schematic partial end face views of a layered structure body or the like for illustrating a method of manufacturing a light emitting element of Embodiment 2.
Figure 13B:
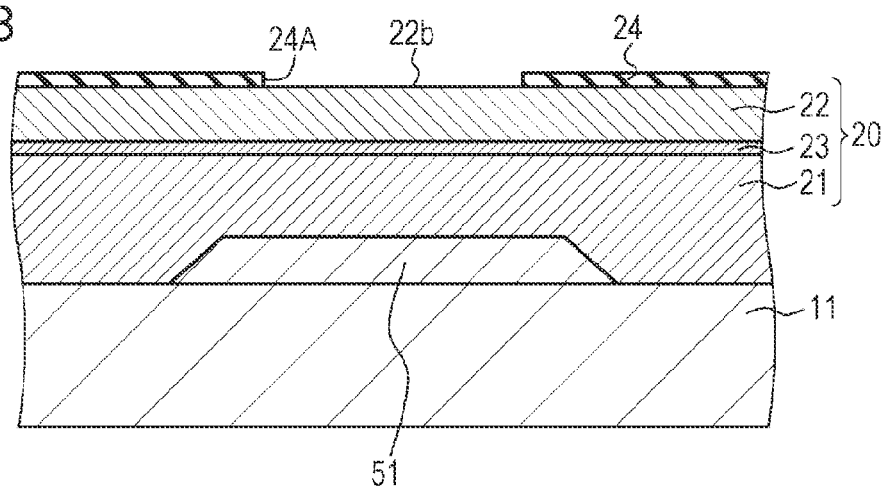
Figure 13C:
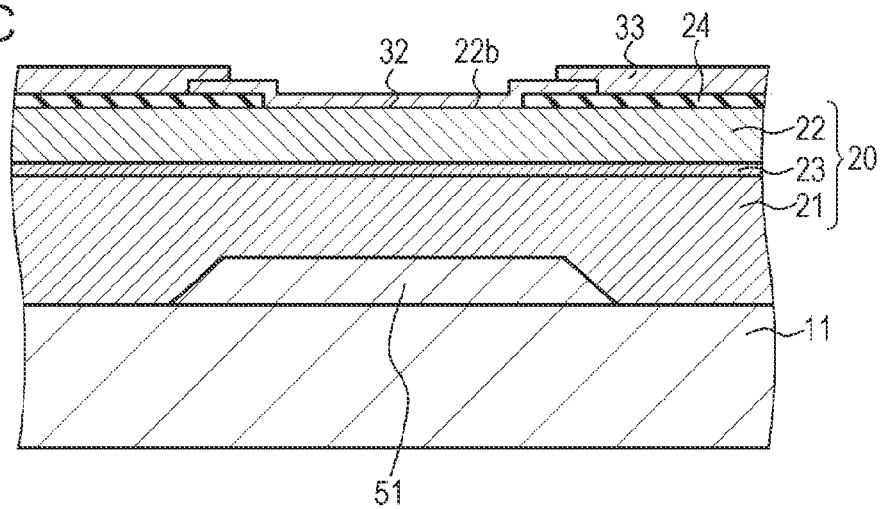
Figure 14A:
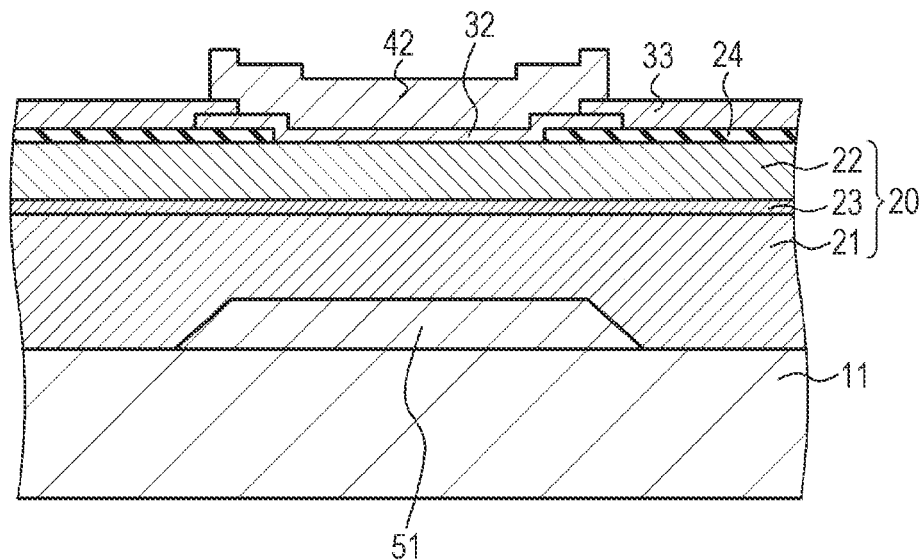
FIGS. 14A and 14B are schematic partial end face views of the layered structure body or the like for illustrating the method of manufacturing a light emitting element of Embodiment 2, continuing from FIG. 13C.
Figure 14B:
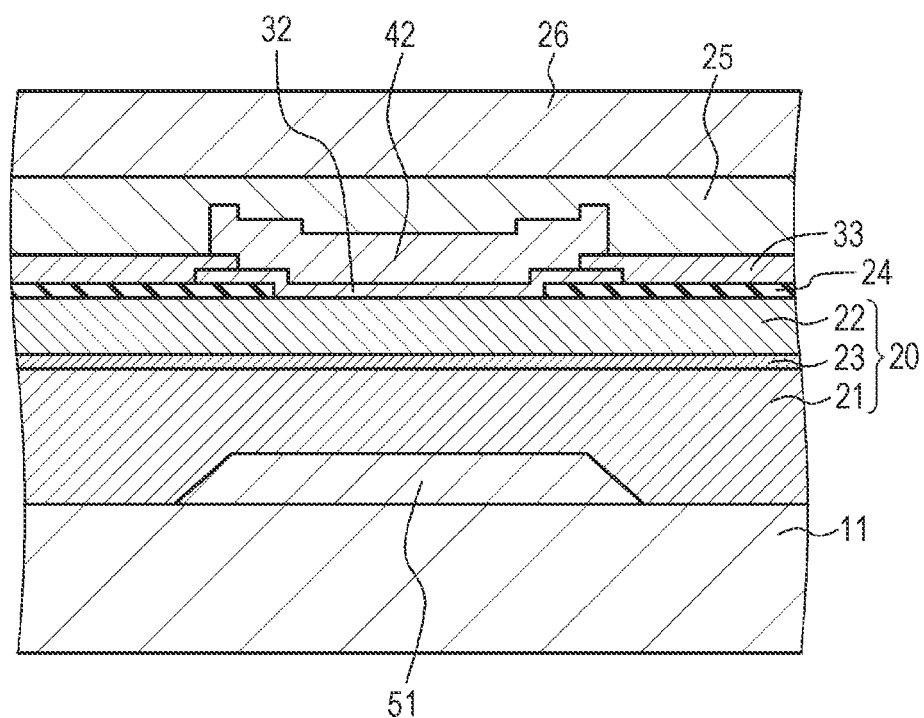
Figure 15A:
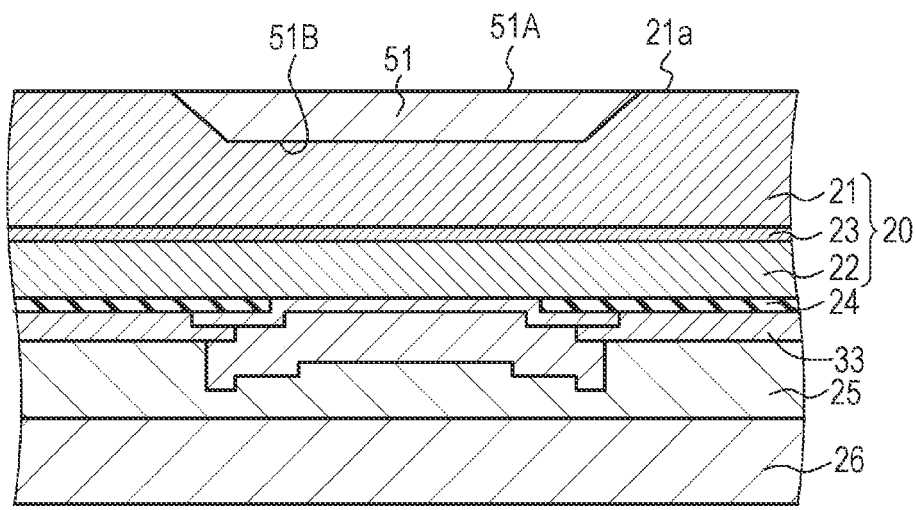
FIGS. 15A and 15B are schematic partial end face views of the layered structure body or the like for illustrating the method of manufacturing a light emitting element of Embodiment 2, continuing from FIG. 14B.
Figure 15B:
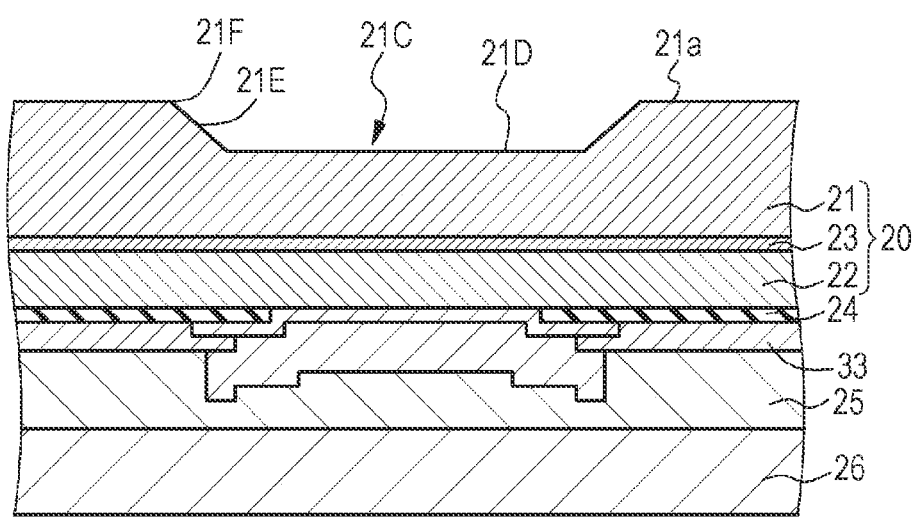
Figure 16:
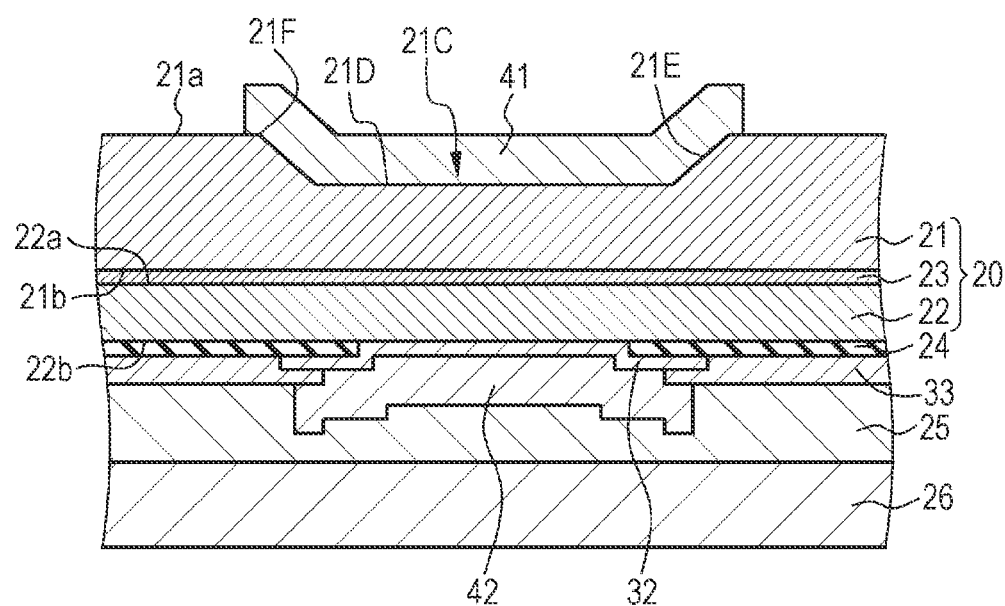
FIG. 16 is a schematic partial end face view of the layered structure body or the like for illustrating the method of manufacturing a light emitting element of Embodiment 2, continuing from FIG. 15B.

In Step-250, the part of the first surface 21a of the first compound semiconductor layer 21 on which the first electrode 31 is to be formed may be etched before forming the first electrode 31 on the first surface 21a of the first compound semiconductor layer 21, and, in this case, the exposed first compound semiconductor layer 21 may be etched based on a reactive ion etching method. Thereby, a rough surface region 21A is formed on the first surface 21a of the first compound semiconductor layer 21. The first electrode 31 may be formed on at least the etched first compound semiconductor layer 21. Although schematic partial end face views of the light emitting element obtained in this way are shown in FIGS. 7B, 8A and 8B, in the example of the light emitting element shown in FIG. 7B, the end portion of the first electrode 31 is separated from the first light reflecting layer 41. Meanwhile, in the example of the light emitting element shown in FIG. 8A, the end portion of the first electrode 31 contacts the first light reflecting layer 41. In the example of the light emitting element shown in FIG. 8B, the end portion of the first electrode 31 is formed over the edge portion of the first light reflecting layer 41. Since the first electrode 31 is formed on the rough surface region 21A, it is possible to suppress a rise in the contact resistance between the first compound semiconductor layer 21 and the first electrode 31.

The value of the surface roughness Ra of the first surface 21a of the first compound semiconductor layer 21 in the interface of the first light reflecting layer 41 and the first surface 21a of the first compound semiconductor layer 21 is $3 \times 10^{-9}$ m or less, and the value of the surface roughness Ra of the first surface 21a of the first compound semiconductor layer 21 on which the first electrode 31 is to be formed exceeds the value of the surface roughness Ra of the first surface 21a of the first compound semiconductor layer 21 in the interface of the first light reflecting layer 41 and the first surface 21a of the first compound semiconductor layer 21.

$R_1/R_2 \le 1$ is satisfied, where the contact resistance value of the first surface 21a of the first compound semiconductor layer 21 in the interface between the first light reflecting layer 41 and the first surface 21a of the first compound semiconductor layer 21 is $R_1$, and the contact resistance value in the first surface 21a of the first compound semiconductor layer 21 on which the first electrode 31 is to be formed is $R_2$.

As the procedure of removing the convexity, forming the first light reflecting layer, etching the first compound semiconductor layer, and forming the first electrode, it is possible to use the procedures below in addition to the above procedure.

(1) removal of the convexity, etching of the first compound semiconductor layer, formation of the first light reflecting layer, formation of the first electrode (2) removal of the convexity, etching of the first compound semiconductor layer, formation of the first electrode, formation of the first light reflecting layer (3) etching of the first compound semiconductor layer, removal of the convexity, formation of the first light reflecting layer, formation of the first electrode (4) etching of the first compound semiconductor layer, removal of the convexity, formation of the first electrode, formation of the first light reflecting layer (5) etching of the first compound semiconductor layer, formation of the first electrode, removal of the convexity, formation of the first light reflecting layer In the example of the light emitting element shown in FIGS. 7B, 8A and 8B, although the first surface 21a of the first compound semiconductor layer 21 is etched so that the side surface of the first light reflecting layer 41 and the side surface of the rough surface region 21A of the first surface 21a of the first compound semiconductor layer 21 match, the side surface of the rough surface region 21A of the first surface 21a of the first compound semiconductor layer 21 may be formed further to the outside than the side surface of the first light reflecting layer 41, as shown in FIGS. 9A, 9B, 10A, and 10B. In the example of the light emitting element shown in FIGS. 9A and 9B, the end portion of the first electrode 31 is separated from the first light reflecting layer 41. In the example of a light emitting element shown in FIG. 9A, the end portion of the first electrode 31 is separated from the side surface of the rough surface region 21A, and in the example of a light emitting element shown in FIG. 9B, the end portion of the first electrode 31 contacts the side surface of the rough surface region 21A. In the example of the light emitting element shown in FIG. 10A, the end portion of the first electrode 31 contacts the first light reflecting layer 41. In the example of the light emitting element shown in FIG. 10B, the end portion of the first electrode 31 is formed over the edge portion of the first light reflecting layer 41. In the light emitting element shown in FIGS. 9A, 9B, 10A, and 10B, a protrusion part 21G of the first compound semiconductor layer is present between the first light reflecting layer 41 and the first electrode 31.

In the example of a light emitting element shown in FIGS. 11A, 11B, 12A, and 12B, the first light reflecting layer 41 extends on the first electrode 31. In the example of a light emitting element shown in FIG. 11A, the first electrode 31 is provided separated from the opening portion 21F positioned on the first surface 21a of the first compound semiconductor layer 21, and in the example of a light emitting element shown in FIG. 11B, the first electrode 31 is provided contacting the opening portion 21F. Meanwhile, in the example of a light emitting element shown in FIGS. 12A and 12B, the first electrode 31 is provided on the rough surface region 21A, in the example of a light emitting element shown in FIG. 12A, the end portion of the first electrode 31 is separated from the side surface of the rough surface region 21A, and in the example of a light emitting element shown in FIG. 12B, the end portion of the first electrode 31 contacts the side surface of the rough surface region 21A.

Embodiment 3

As described above, on the substrate for manufacturing a light emitting element 11 on which the first light reflecting layer 41 or the convexity 51 is formed, when the first compound semiconductor layer 21 is formed using horizontal growth using a method in which epitaxial growth is caused in the horizontal direction, such as an epitaxial lateral overgrowth (ELO) method, if the first compound semiconductor layer 21 that is epitaxially grown from the edge portion of the first light reflecting layer 41 or the convexity 51 towards the center portion of the first light reflecting layer 41 or the convexity 51 meet, there are cases in which numerous crystal defects occur in the meeting part.

Figure 1B:
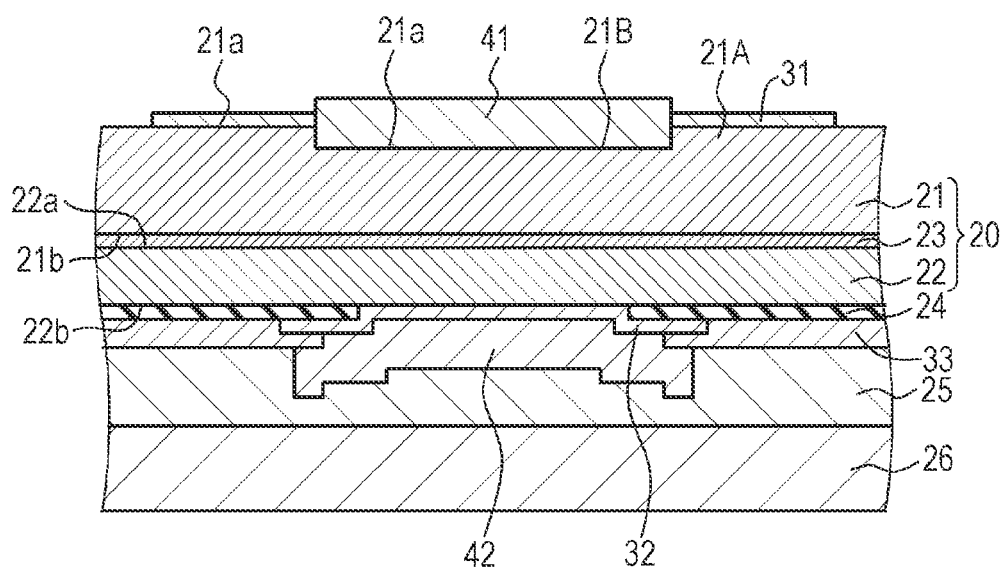
Figure 17:
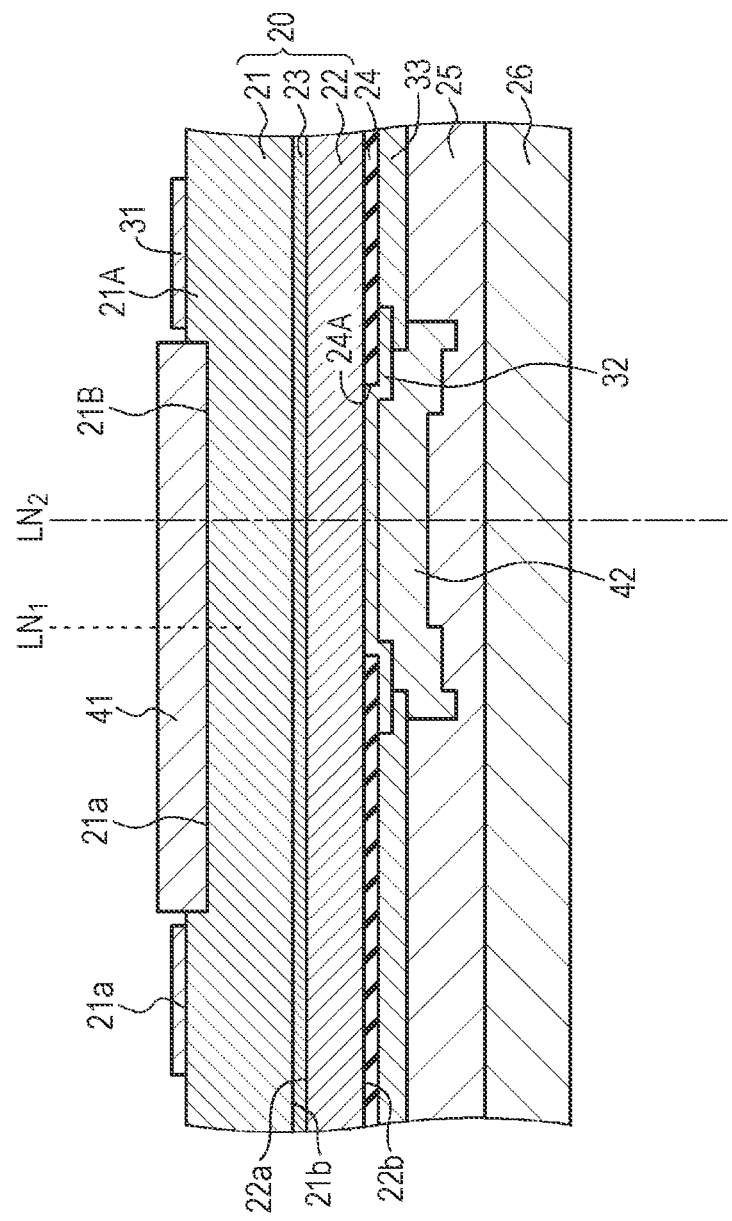
FIG. 17 is a schematic partial end face view of the light emitting element of Embodiment 3 (modification example of Embodiment 1)
Figure 18:
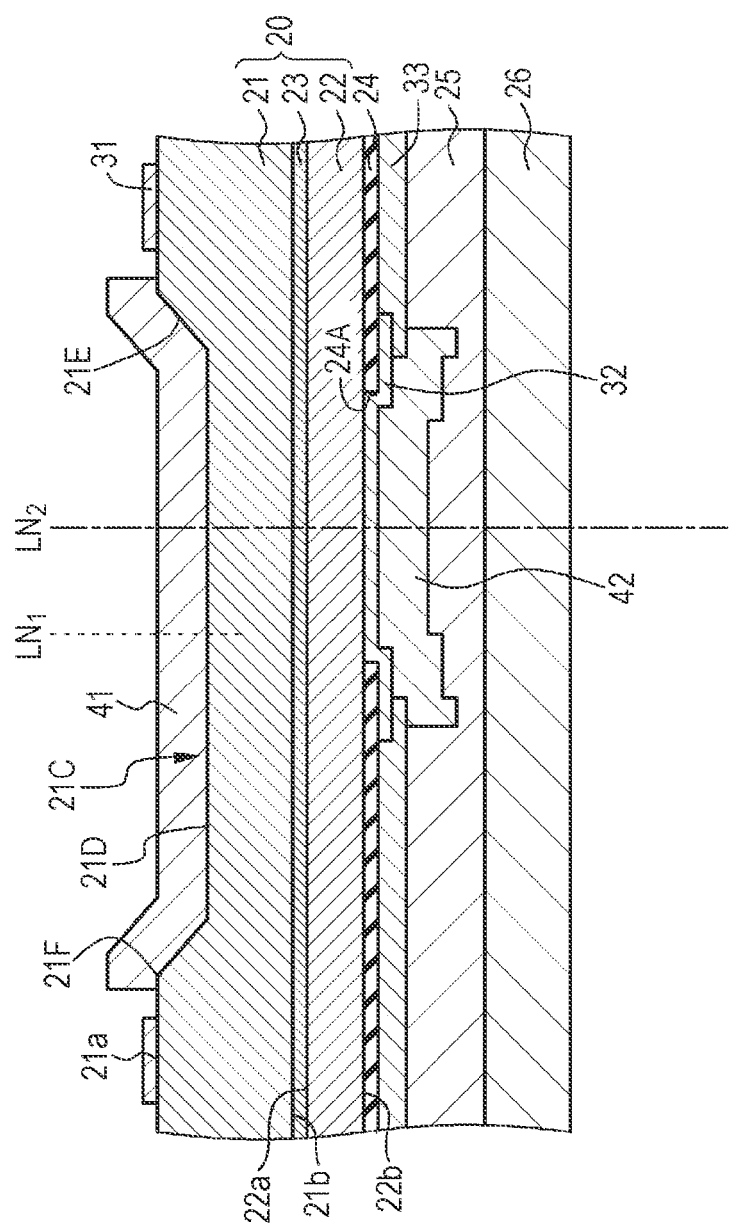
FIG. 18 is a schematic partial end face view of the light emitting element of Embodiment 3 (modification example of Embodiment 2).

In the light emitting element of Embodiment 3 or in the method of manufacturing a light emitting element of Embodiment 3, the area centroid of the second light reflecting layer 42 is not present on the normal line LN1 with respect to the first light reflecting layer 41 passing through area centroid of the first light reflecting layer 41, as shown in FIG. 17 by the modification example of the light emitting element shown in FIG. 1A, and in FIG. 18 by the modification example of the light emitting element shown in FIG. 6A. Alternatively, the area centroid of the active layer 23 is not present on the normal line LN1 with respect to the first light reflecting layer 41 that passes through the area centroid of the first light reflecting layer 41. The normal line with respect to the second light reflecting layer 42 that passes through the area centroid of the second light reflecting layer 42 matches the normal line with respect to the active layer 23 that passes through the area centroid of the active layer 23, and this line is indicated by "LN2". Needless to say, it is possible to adopt the configuration and structure of a light emitting element of Embodiment 3 with respect to the light emitting element shown in FIGS. 1B, 2, 6B, 7A, 7B, 8A, 8B, 9A, 9B, 10A, 10B, 11A, 11B, 12A, and 12B. Other than the above points, since configuration and structure of the light emitting element of Embodiment 3 are the same as the configuration and structure of the light emitting element of Embodiments 1 and 2, a detailed description will not be made.

$S_3 > S_4$ is satisfied, where the area of a part of the first light reflecting layer 41 that contacts the first surface 21a of the first compound semiconductor layer 21 (part of the first light reflecting layer 41 opposing the second light reflecting layer 42) that configures the element region is $S_3$, and the area of a part of the second light reflecting layer 42 opposing the second surface 22b of the second compound semiconductor layer 22 (part of the second light reflecting layer 42 opposing the first light reflecting layer 41) that configures the element region is $S_4$.

In Embodiment 3, the meeting part in which numerous crystal defects are present (specifically, positioning on the normal line LN1 or in the vicinity thereof) is not positioned in the center portion of the element region, and the occurrence of a negative influence on the characteristics of the light emitting element is eliminated, or the negative influence on the characteristics of the light emitting element is reduced.

Above, although the present disclosure has been described based on preferred examples, the present disclosure is not limited to these examples. The configuration and structure of the light emitting element described in the examples are examples and may be changed, as appropriate. It is also possible to change the method of manufacturing a light emitting element of the examples, as appropriate. It is possible to make a surface-emitting laser element that emits light from the top surface of the second compound semiconductor layer via the second light reflecting layer by suitably selecting the bonding layer and support substrate, according to the circumstances. It is possible to use a surface-emitting laser element that emits light from the top surface of the second compound semiconductor layer via the second light reflecting layer, also by making the light emitting element obtained in the steps up to Step-130 into a completed product. Alternatively, in Step-160 and Step-260, by removing the support substrate after the first light reflecting layer and the first electrode are formed, it is possible for the surface-emitting laser element that emits light from the top surface the second compound semiconductor layer via the second light reflecting layer to be completed, or after Step-160 and Step-260, by fixing the first light reflecting layer to the second support substrate, and thereafter the second light reflecting layer being exposed by removing the support substrate, it is possible for the surface-emitting laser element that emits light from the top surface of the second compound semiconductor layer via the second light reflecting layer to be completed.

The present disclosure may take the configurations as below.

[A01] Method of Manufacturing Light Emitting Element

First Embodiment

A method of manufacturing a light emitting element includes, sequentially (a) forming a first light reflecting layer having a convex shape formed from a multilayer film on a substrate for manufacturing a light emitting element; (b) forming a layered structure body by layering a first compound semiconductor layer formed from a GaN-based compound semiconductor, which has a first surface and a second surface opposing the first surface, an active layer formed from a GaN-based compound semiconductor, which contacts the second surface of the first compound semiconductor layer, and a second compound semiconductor layer formed from a GaN-based compound semiconductor, which has a first surface and a second surface opposing the first surface, in which the first surface contacts the active layer on the substrate for manufacturing a light emitting element that includes the first light reflecting layer; (c) forming, on the second surface of the second compound semiconductor layer, a second electrode and a second light reflecting layer formed from a multilayer film; (d) fixing the second light reflecting layer to a support substrate; (e) removing the substrate for manufacturing a light emitting element, and exposing the first surface of the first compound semiconductor layer and the first light reflecting layer; (f) etching the first surface of the first compound semiconductor layer; and (g) forming a first electrode on at least the etched first surface of the first compound semiconductor layer.

[A02] The method of manufacturing a light emitting element according to [A01], in which exposure of the first surface of the first compound semiconductor layer and the first light reflecting layer in (e) is performed based on a chemical/mechanical polishing method.

[A03] The method of manufacturing a light emitting element according to [A01] or [A02], in which a part of the first surface of the first compound semiconductor layer on which the first electrode is to be formed is etched based on a reactive ion etching method.

[A04] The method of manufacturing a light emitting element according to any one of [A01] to [A03], in which an area centroid of the second light reflecting layer is not present on a normal line with respect to the first light reflecting layer that passes through the area centroid of the first light reflecting layer.

[A05] The method of manufacturing a light emitting element according to any one of [A01] to [A04], in which an area centroid of the active layer is not present on a normal line with respect to the first light reflecting layer that passes through the area centroid of the first light reflecting layer.

[A06] A method of manufacturing a light emitting element according to any one of [A01] to [A05] in which the first light reflecting layer and the first electrode are in contact.

[A07] The method of manufacturing a light emitting element according to any one of [A01] and [A05] in which the first light reflecting layer and the first electrode are separated, and the separation distance is within 1 mm.

[A08] The method of manufacturing a light emitting element according to any one of [A01] and [A07], in which the distance from the first light reflecting layer to the second light reflecting layer is 0.15 μm or more and 50 μm or less.

[A09] The method of manufacturing a light emitting element according to any one of [A01] to [A08], in which light generated in the active layer is emitted to the outside via the first light reflecting layer.

[A10] The method of manufacturing a light emitting element according [A09], in which $S_1 > S_2$ is satisfied, where the area of a part of the first light reflecting layer that contacts the first surface of the first compound semiconductor layer is $S_1$, and the area of a part of the second light reflecting layer opposing the second surface of the second compound semiconductor layer is $S_2$.

[A11] The method of manufacturing a light emitting element according to any one of [A01] to [A10], in which a value of the surface roughness Ra of a part of the first surface of the first compound semiconductor layer that contacts the first light reflecting layer is $3 \times 10^{-9}$ m or less, and the value of the surface roughness Ra of a part of the first surface of the first compound semiconductor layer on which the first electrode is formed exceeds the value of the surface roughness Ra of a part of the first surface of the first compound semiconductor layer that contacts the first light reflecting layer.

[A12] The method of manufacturing a light emitting element according to any one of [A01] to [A11], in which $R_2/R_1 \leq 1$ is satisfied, where the contact resistance value of a part of the first surface of the first compound semiconductor layer that contacts the first light reflecting layer is $R_1$, and the contact resistance value of a part of the first surface of the first compound semiconductor layer on which the first electrode is formed is $R_2$.

[A13] The method of manufacturing a light emitting element according to any one of [A01] to [A12], in which the first electrode is formed from a metal or an alloy.

[A14] The method of manufacturing a light emitting element according to any one of [A01] to [A13], in which the second electrode is formed from a transparent conductive material.

[A15] The method of manufacturing a light emitting element according to any one of [A01] to [A14], in which the light emitting element is formed from a surface-emitting laser element.

[B01] Method of Manufacturing Light Emitting Element

Second Embodiment

A method of manufacturing a light emitting element includes, sequentially, (a) forming a convexity formed from a material different from a material that configures a first compound semiconductor layer on a substrate for manufacturing a light emitting element; (b) forming a layered structure body by layering a first compound semiconductor layer formed from a GaN-based compound semiconductor, which has a first surface and a second surface opposing the first surface, an active layer formed from a GaN-based compound semiconductor, which contacts the second surface of the first compound semiconductor layer, and a second compound semiconductor layer formed from a GaN-based compound semiconductor, which has a first surface and a second surface opposing the first surface, in which the first surface contacts the active layer on the substrate for manufacturing a light emitting element that includes the convexity; (c) forming, on the second surface of the second compound semiconductor layer, a second electrode and a second light reflecting layer formed from a multilayer film; (d) fixing the second light reflecting layer to a support substrate; (e) removing the substrate for manufacturing a light emitting element, and exposing the first surface of the first compound semiconductor layer and the convexity; and (f) removing the convexity, forming a first light reflecting layer formed from a multilayer film on at least a part of the first surface on the first compound semiconductor layer from which the convexity is removed, and forming a first electrode on at least a part of the first surface of the first compound semiconductor layer on which at least the first electrode is to be formed.

[B02] The method of manufacturing a light emitting element according to [B01], in which exposure of the first surface of the first compound semiconductor layer and the convexity in (e) is performed based on a chemical/mechanical polishing method.

[B03] The method of manufacturing a light emitting element according to [B01] or [B02], in which a part of the first surface of the first compound semiconductor layer on which the first electrode is to be formed is etched before the first electrode is formed on the first surface of the first compound semiconductor layer in (f).

[B04] The method of manufacturing a light emitting element according to [B03], in which a part of the first surface of the first compound semiconductor layer on which the first electrode is to be formed is etched based on a reactive ion etching method.

[B05] The method of manufacturing a light emitting element according to any one of [B01] to [B04], in which the convexity formed in step (a) has a top surface smaller than a bottom surface.

[B06] The method of manufacturing a light emitting element according to any one of [B01] to [B05], in which an area centroid of the second light reflecting layer is not present on a normal line with respect to the first light reflecting layer that passes through the area centroid of the first light reflecting layer.

[B07] The method of manufacturing a light emitting element according to any one of [B01] to [B06], in which an area centroid of the active layer is not present on a normal line with respect to the first light reflecting layer that passes through the area centroid of the first light reflecting layer.

[B08] The method of manufacturing a light emitting element according to any one of [B01] to [B07] in which the first light reflecting layer and the first electrode are in contact.

[B09] The method of manufacturing a light emitting element according to any one of [B01] to [B07] in which the first light reflecting layer and the first electrode are separated, and the separation distance is within 1 mm.

[B10] The method of manufacturing a light emitting element according to [B09], in which a protrusion part of the first compound semiconductor layer is present between the first light reflecting layer and the first electrode.

[B11] The method of manufacturing a light emitting element according to any one of [B01] and [B10], in which the distance from the first light reflecting layer to the second light reflecting layer is 0.15 μm or more and 50 μm or less.

[B12] The method of manufacturing a light emitting element according to any one of [B01] to [B11], in which light generated in the active layer is emitted to the outside via the first light reflecting layer.

[B13] The method of manufacturing a light emitting element according [B12], in which $S_1 > S_2$ is satisfied, where the area of a part of the first light reflecting layer that contacts the first surface of the first compound semiconductor layer is $S_1$, and the area of a part of the second light reflecting layer opposing the second surface of the second compound semiconductor layer is $S_2$.

[B14] The method of manufacturing of a light emitting element according to any one of [B01] to [B14], in which a value of the surface roughness Ra of a part of the first surface of the first compound semiconductor layer that contacts the first light reflecting layer is $3 \times 10^{-9}$ m or less, and the value of the surface roughness Ra of a part of the first surface of the first compound semiconductor layer on which the first electrode is formed exceeds the value of the surface roughness Ra of a part of the first surface of the first compound semiconductor layer that contacts the first light reflecting layer.

[B15] The method of manufacturing a light emitting element according to any one of [B01] to [B14], in which $R_2/R_1 \leq 1$ is satisfied, where the contact resistance value of a part of the first surface of the first compound semiconductor layer that contacts the first light reflecting layer is $R_1$, and the contact resistance value of a part of the first surface of the first compound semiconductor layer on which the first electrode is formed is $R_2$.

[B16] The method of manufacturing a light emitting element according to any one of [B01] to [B15], in which the first electrode is formed from a metal or an alloy.

[B17] The method of manufacturing a light emitting element according to any one of [B01] to [B16], in which the second electrode is formed from a transparent conductive material.

[B18] The method of manufacturing a light emitting element according to any one of [B01] to [B17], in which the light emitting element is formed from a surface-emitting laser element.

[C01] Light Emitting Element

A light emitting element includes (A) a layered structure body formed by layering a first compound semiconductor layer formed from a GaN-based compound semiconductor, which has a first surface and a second surface opposing the first surface, an active layer formed from a GaN-based compound semiconductor, which contacts the second surface of the first compound semiconductor layer, and a second compound semiconductor layer formed from a GaN-based compound semiconductor, which has a first surface and a second surface opposing the first surface, and in which the first surface contacts the active layer; (B) a first electrode and a first light reflecting layer; and (C) a second electrode and a second light reflecting layer formed from a multi layer film formed on the second surface of the second compound semiconductor layer, in which a concavity with a forward tapered side surface is formed on the first surface of the first compound semiconductor layer, the first light reflecting layer is formed on at least the concavity, and the first electrode is formed on at least the first surface of the first compound semiconductor layer.

[C02] The light emitting element according to [C01], in which an area centroid of the second light reflecting layer is not present on a normal line with respect to the first light reflecting layer that passes through the area centroid of the first light reflecting layer.

[C03] The light emitting element according to [C01] or [C02], in which an area centroid of the active layer is not present on a normal line with respect to the first light reflecting layer that passes through the area centroid of the first light reflecting layer.

[C04] The light emitting element according to any one of [C01] to [C03], in which light generated in the active layer is emitted to the outside via the first light reflecting layer.

[C05] The light emitting element according to [C04], in which $S_1 > S_2$ is satisfied, where the area of a part of the first light reflecting layer that contacts the first surface of the first compound semiconductor layer is $S_1$, and the area of a part of the second light reflecting layer opposing the second surface of the second compound semiconductor layer is $S_2$.

[C06] The light emitting element according to any one of [C01] to [C05], in which a value of the surface roughness Ra of a part of the first surface of the first compound semiconductor layer that contacts the first light reflecting layer is $3 \times 10^{-9}$ m or less, and the value of the surface roughness Ra of a part of the first surface of the first compound semiconductor layer on which the first electrode is formed exceeds the value of the surface roughness Ra of a part of the first surface of the first compound semiconductor layer that contacts the first light reflecting layer.

[C07] The light emitting element according to any one of [C01] to [C06], in which $R_2/R_1 \leq 1$ is satisfied, where the contact resistance value of a part of the first surface of the first compound semiconductor layer that contacts the first light reflecting layer is $R_1$, and the contact resistance value of a part of the first surface of the first compound semiconductor layer on which the first electrode is formed is $R_2$.

[C08] The light emitting element according to any one of [C01] to [C07], in which the first light reflecting layer and the first electrode are in contact.

[C09] The light emitting element according to any one of [C01] and [C07] in which the first light reflecting layer and the first electrode are separated, and the separation distance is within 1 mm.

[C10] The light emitting element according to [C09], in which a protrusion part of the first compound semiconductor layer is present between the first light reflecting layer and the first electrode.

[C11] The light emitting element according to any one of [C01] and [C10], in which the distance from the first light reflecting layer and the second light reflecting layer is 0.15 μm or more and 50 μm or less.

[C12] The light emitting element according to any one of [C01] to [C11], in which the second light reflecting layer is fixed to the support substrate.

[C13] The light emitting element according to any one of [C01] to [C12], in which the first electrode is formed from a metal or an alloy.

[C14] The light emitting element according to any one of [C01] to [C13], in which the second electrode is formed from a transparent conductive material.

[C15] The light emitting element according to any one of [C01] to [C14], in which the light emitting element is formed from a surface-emitting laser element.

It should be understood by those skilled in the art that various modifications, combinations, sub-combinations and alterations may occur depending on design requirements and other factors insofar as they are within the scope of the appended claims or the equivalents thereof.

What is claimed is:

1. A method of manufacturing a light emitting element comprising:
    forming, on a substrate for manufacturing a light emitting element, a first light reflecting layer having a convex shape formed from a multilayer film;
    forming, on the first light reflecting layer and the substrate for manufacturing the light emitting element, a layered structure body by layering:
        a first compound semiconductor layer formed from a GaN-based compound semiconductor, which has a first surface and a second surface opposing the first surface, and in which the first surface contacts the first light reflecting layer and the substrate for manufacturing the light emitting element,
        an active layer formed from a GaN-based compound semiconductor, which contacts the second surface of the first compound semiconductor layer, and
        a second compound semiconductor layer formed from a GaN-based compound semiconductor, which has a first surface and a second surface opposing the first surface, and in which the first surface contacts the active layer;
    forming, on the second surface of the second compound semiconductor layer, a first electrode;
    forming, on at least a portion of the first electrode, a second light reflecting layer formed from a multilayer film;
    fixing the second light reflecting layer to a support substrate;
    removing the substrate for manufacturing the light emitting element, and exposing the first surface of the first compound semiconductor layer and the first light reflecting layer;
    etching the first surface of the first compound semiconductor layer; and
    forming a second electrode on at least the etched first surface of the first compound semiconductor layer.

2. The method of manufacturing a light emitting element according to claim 1, wherein exposure of the first surface of the first compound semiconductor layer and the first light reflecting layer is performed based on a chemical/mechanical polishing method.

3. The method of manufacturing a light emitting element according to claim 1, wherein a part of the first surface of the first compound semiconductor layer on which the second electrode is to be formed is etched based on a reactive ion etching method.

4. The method of manufacturing a light emitting element according to claim 1, wherein an area centroid of the second light reflecting layer is not present on a normal line with respect to the first light reflecting layer that passes through an area centroid of the first light reflecting layer.

5. The method of manufacturing a light emitting element according to claim 1, wherein an area centroid of the active layer is not present on a normal line with respect to the first light reflecting layer that passes through an area centroid of the first light reflecting layer.

6. The method of manufacturing a light emitting element according to claim 1, wherein $S_1 > S_2$ is satisfied, where an area of a part of the first light reflecting layer that contacts the first surface of the first compound semiconductor layer is $S_1$, and an area of a part of the second light reflecting layer opposing the second surface of the second compound semiconductor layer is $S_2$.

7. The method of manufacturing a light emitting element according to claim 1, wherein a distance from the first light reflecting layer to the second light reflecting layer is greater than 0.15 μm.

8. The method of manufacturing a light emitting element according to claim 1, wherein a distance from the first light reflecting layer to the second light reflecting layer is less than 50 μm.

9. The method of manufacturing a light emitting element according to claim 1, wherein a distance from the first light reflecting layer to the second light reflecting layer is greater than 0.15 μm and less than 50 μm.

10. The method of manufacturing a light emitting element according to claim 1, wherein the second electrode is separated from the first light reflecting layer.

11. The method of manufacturing a light emitting element according to claim 10, wherein a separation distance between the second electrode and the first light reflecting layer is within 1 mm.

12. The method of manufacturing a light emitting element according to claim 1, wherein the first electrode is formed from a material that is different from the second electrode.

13. The method of manufacturing a light emitting element according to claim 1, wherein the first electrode includes a transparent conductive material.

* * * * *